(12) United States Patent
Tomimbang et al.

(10) Patent No.: US 9,978,553 B2
(45) Date of Patent: May 22, 2018

(54) APPARATUS, SYSTEM AND METHOD FOR TOTAL PROTECTION FROM ELECTRICAL FAULTS

(71) Applicants: Wendell E Tomimbang, St. Cloud, FL (US); Mayule Tomimbang, St. Cloud, FL (US)

(72) Inventors: Wendell E Tomimbang, St. Cloud, FL (US); Mayule Tomimbang, St. Cloud, FL (US)

( * ) Notice: Subject to any disclaimer, the term of this patent is extended or adjusted under 35 U.S.C. 154(b) by 561 days.

(21) Appl. No.: 14/583,174

(22) Filed: Dec. 25, 2014

(65) Prior Publication Data

US 2015/0109077 A1   Apr. 23, 2015

Related U.S. Application Data

(63) Continuation-in-part of application No. 13/528,809, filed on Jun. 20, 2012, now Pat. No. 8,995,098.

(51) Int. Cl.
| | |
|---|---|
| H02H 9/08 | (2006.01) |
| H01H 83/20 | (2006.01) |
| G01R 31/04 | (2006.01) |
| H02H 1/00 | (2006.01) |
| H02H 11/00 | (2006.01) |
| H02H 3/10 | (2006.01) |
| H01H 71/74 | (2006.01) |
| G01R 31/02 | (2006.01) |

(52) U.S. Cl.
CPC ........... *H01H 83/20* (2013.01); *G01R 31/041* (2013.01); *H02H 1/0015* (2013.01); *H02H 3/10* (2013.01); *H02H 11/002* (2013.01); *G01R 31/024* (2013.01); *H01H 2071/7472* (2013.01)

(58) Field of Classification Search
USPC .......................................... 361/42
See application file for complete search history.

(56) References Cited

U.S. PATENT DOCUMENTS

| | | | |
|---|---|---|---|
| 6,948,846 B2 * | 9/2005 | Engel ................. | G01K 3/14 361/42 |
| 7,697,248 B2 * | 4/2010 | Tomimbang ......... | H02H 1/0015 361/42 |

(Continued)

*Primary Examiner* — Ronald W Leja
(74) *Attorney, Agent, or Firm* — The Miller Law Offices PLC; Steven J. Miller, Esq.

(57) ABSTRACT

Electrical fire risks and consumer safety are major concerns driving regulators worldwide to implement more stringent electrical code and enforcement. While there are many commercially available protective devices available, none affords total protection, and they are made and classified only to protect circuits from specific or limited number of faults. This invention is about an apparatus, system and method for protection of electrical circuits and consumers from literally all known electrical faults in Direct Current (DC) and Alternating Current (AC) single and multi-phase systems such as and including Arc Faults, Ground and Leakage Faults, Surge, Overload, Short Circuit, Glowing Connections, Miswired Connections, overvoltage, undervoltage and Phase-Loss. Said apparatus, system and method come in the form of or in a housing as a Circuit Breaker, Receptacle, Convenience Outlet, Attachment Plug, Equipment Controller, a circuit, or a system integrated with another system, device or apparatus.

31 Claims, 20 Drawing Sheets

(56) References Cited

U.S. PATENT DOCUMENTS

| | | | | |
|---|---|---|---|---|
| 7,787,223 | B2* | 8/2010 | Bilac | G01R 31/3333 |
| | | | | 361/42 |
| 8,817,431 | B2* | 8/2014 | Tomimbang | H02H 1/0015 |
| | | | | 361/42 |
| 8,854,066 | B2* | 10/2014 | Shea | G01R 31/04 |
| | | | | 324/705 |
| 8,879,218 | B2* | 11/2014 | Tomimbang | H02H 1/0015 |
| | | | | 361/42 |
| 8,995,098 | B2* | 3/2015 | Tomimbang | H02H 11/002 |
| | | | | 361/115 |
| 2010/0046126 | A1* | 2/2010 | Elms | H01H 83/04 |
| | | | | 361/42 |
| 2011/0216753 | A1* | 9/2011 | Kneckt | H04L 45/70 |
| | | | | 370/338 |

* cited by examiner

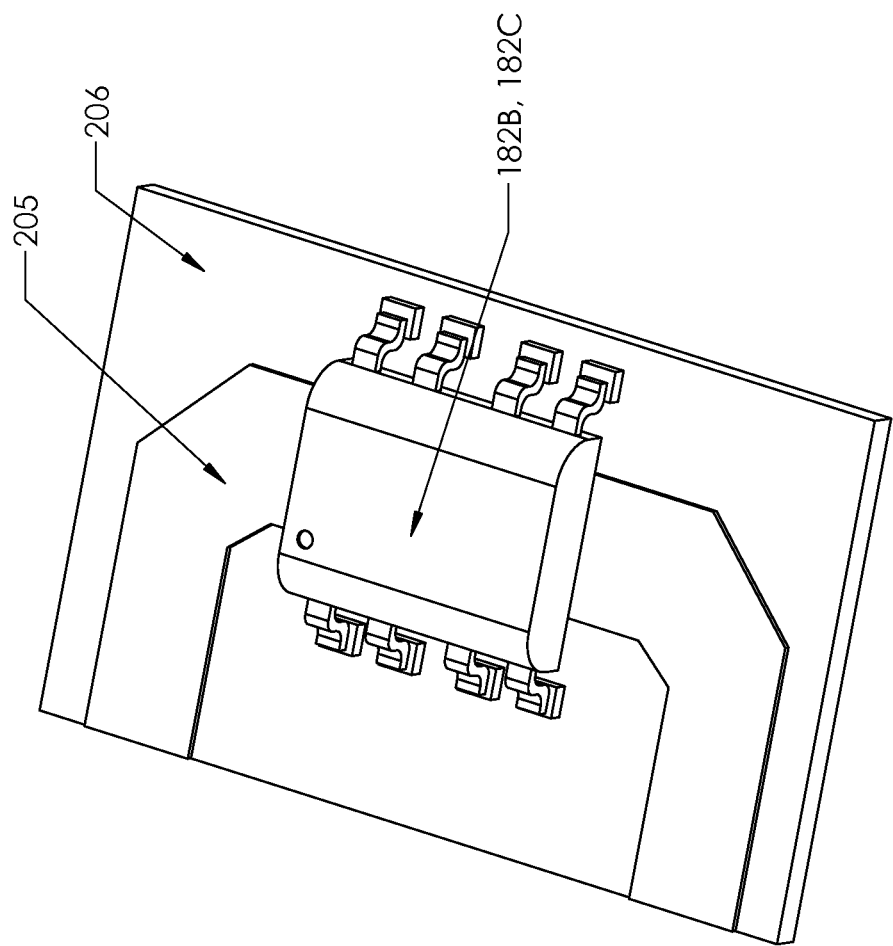

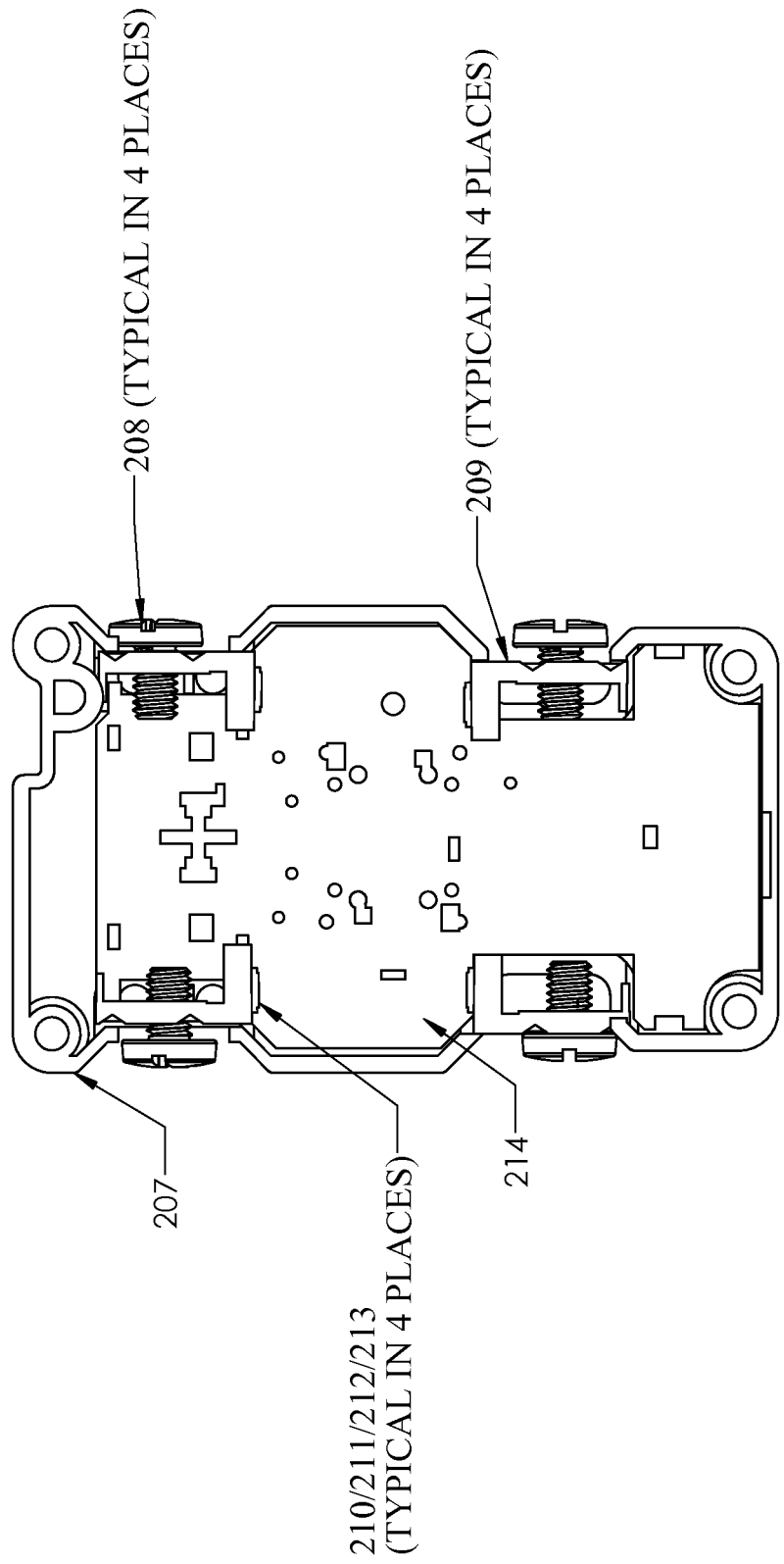

SIDE VIEW

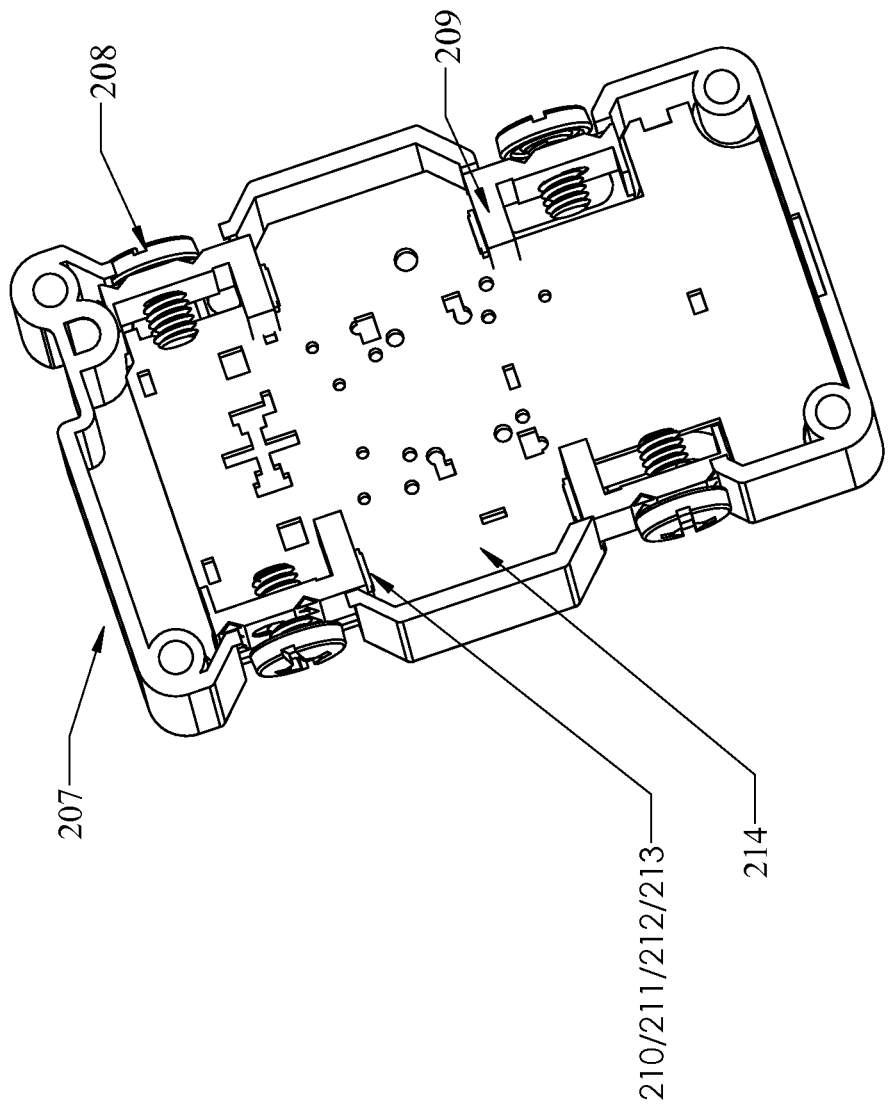

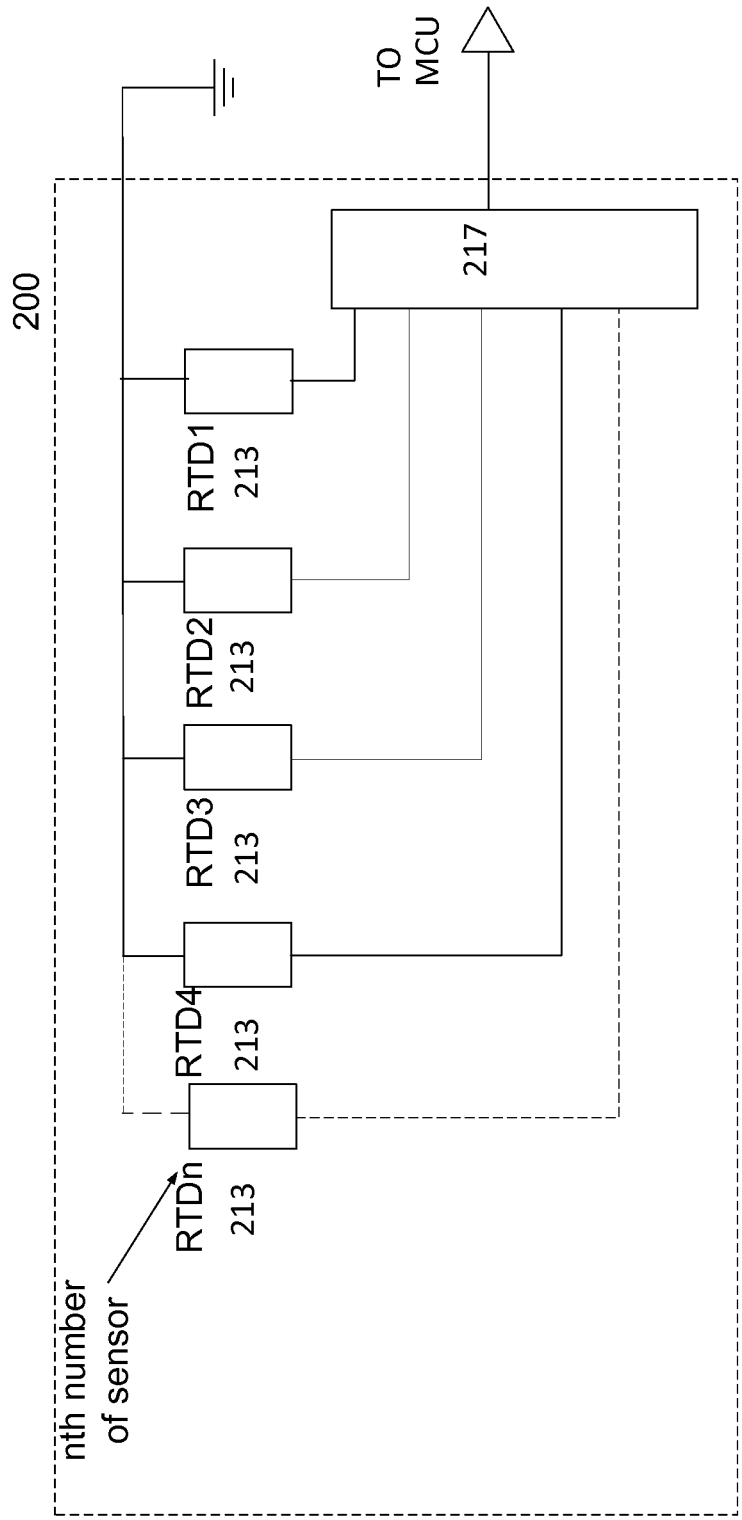

APPARATUS, SYSTEM AND METHOD FOR TOTAL PROTECTION FROM ELECTRICAL FAULTS

CROSS REFERENCE TO RELATED APPLICATIONS

This application is a continuation-in-part of U.S. patent application Ser. No. 13/528,809 filed on Jun. 20, 2012.

STATEMENT REGARDING FEDERALLY SPONSORED RESEARCH OR DEVELOPMENT

Not Applicable

DESCRIPTION OF ATTACHED APPENDIX

Not Applicable

BACKGROUND OF THE INVENTION

As useful electricity is to our daily lives, it is very dangerous and destructive at the same time, if installations are not done properly or if protection is inadequate. This involves safety of personnel or consumers as well as risk to properties from electrical fires. Protective devices are commercially available that address specific electrical faults, such as and including Ground Fault Circuit Interrupters (GFCIs) for ground fault protection, Arc Fault Circuit Interrupters (AFCIs) for arc fault protection, Surge Suppressors for surge protection, and others. Providing literally complete or total protection, this invention covers apparatus, system and method that protect circuits from all types of electrical faults in Direct Current (DC) and Alternating Current (AC) single and multi-phase systems including Arc Faults, Ground and Leakage Faults, Surge Faults, Overload, Overvoltage, Undervoltage, Short Circuit, Glowing Connections, Miswire Connections, and Phase-Loss. This total protection apparatus come in the form of a Circuit Breaker, Receptacle, Convenience Outlet, Attachment Plug, Equipment Controllers, or a circuit, or system integrated with another device or apparatus. For all intents and purposes of this invention, this apparatus, system and method will be called a Total Protection Circuit Interrupter or TPCI.

AFCIs protect circuits from arcs which can either be a series or parallel arc, the former being a lower current fault which occurs at any point along a current-conductive path, and the latter being a high current fault which occurs across Line and Neutral, Line and Ground, or between two lines, where the fault current may be high enough to be similar or even considered as a short circuit. Some AFCIs are designed to also provide circuit protection from overload, short circuit and other faults. AFCIs may be in the form of a circuit breaker, plug, outlet, receptacle or an integrated part of a circuit or equipment. In 3-phase systems, arcs also occur and therefore AFCIs can be used for protection.

GFCIs protect consumers and circuits from leakage current or ground faults and are typically installed in bathrooms, kitchens or areas with possible exposure to water or splash of water, moisture and similar environment. Ground fault is a condition where current passing through the conductors leak into ground. This poses risk to consumers who may end up becoming the medium or path of the leakage current resulting in shock or even worse. GFCIs may take the form of a circuit breaker, plug, outlet, receptacle or an integrated part of a circuit or apparatus.

Overload which is also known as overcurrent, although mostly neglected until something breaks or fails, is a very common electrical problem in households and industries which can result in fires and damage to electrical circuits and equipment. Consumers have less concern and do not even have the knowledge of what and how much current their electric circuits or devices are designed to safely handle until a circuit fails.

Overvoltage is when the supply voltage applied to a circuit or equipment is over their rated voltage. It can also happen as a result of spikes in supply lines which can damage an electrical circuit or equipment.

Undervoltage is when the supply voltage to a circuit or equipment is under their rated voltage. This can affect the operation of the circuit or equipment and even cause damage.

Short Circuit is a condition where any two conductive parts get into contact with each other causing a very high fault current. This high current when not interrupted within a specified time can cause explosive reaction that can damage the connected devices and equipment, as well as exposing users to risk of electrocution. Short circuit protection is typically afforded by traditional circuit breakers and fuses, and may also be included as additional protection feature of AFCIs, GFCIs, equipment controllers and other devices.

Miswire is a condition where circuits, devices and electrical equipment are improperly wired to the power source. These miswire conditions include Line-Load reverse connection, Line-Neutral reverse connection, and Line-side and Load-side cross wiring connections. Line-Load reverse connection is the most common miswire condition.

Glowing connection which is also known as glowing contact is a phenomenon where two series connections or contacts in a circuit get fused and typically remain red hot building up heat energy high enough to cause fire or damage to surrounding materials. Glowing connection is generally brought about by unstable or loose wire terminations and connections. Although considered a separate electrical fault, it starts as variants of arc faults until the actual glowing connection event. Commercial wiring devices do not typically provide protection from this phenomenon.

Phase loss can occur in circuits and equipment in multi-phase systems, when at least one of the phases lose power. Such devices can be 2-phase wiring devices such as and including outlets, plugs and receptacles. It can also be a 3-phase controller or equipment where loss of a phase is crucial. For safety, good practice requires that the devices or controllers should be able to disengage all phases or lines with the loss of a phase, hence a phase-loss protection is important in multi-phase systems.

Surge are sudden spikes in voltage and is typically caused by certain phenomena such as lightning which can hit power lines and cause damage to circuits and equipment. Surge protection is included as a feature of some AFCIs, GFCIs, equipment controllers and other devices.

The current invention is about an apparatus, system and method for detection and interruption of a multitude of electrical faults and is hereinafter referred to as TPCI, which integrates multiple electrical circuit faults protection into one, utilizing common elements to have a unified circuit, apparatus or system performing all the different functions of otherwise a multitude of elements, circuit, systems and apparatus. Instead of having separate protective devices for specific or a limited number of electrical faults, the TPCI provides protection for all the different faults into one device, utilizing common components including microcontroller, switching and tripping mechanisms, sensors, among others as disclosed herein, thereby offering total circuit protection from electrical faults.

The current invention includes a system and method to enable the TPCI to operate even when connected in circuits with or without ground. This system can be used and incorporated into wiring devices and other apparatus such as and including Ground Fault Circuit Interrupters (GFCI or GFCIs) and Arc Fault Circuit Interrupters (AFCI or AFCIs) to enable them to detect faults when connected in circuits with or without a system ground. AFCIs and GFCIs as a standard are typically used on circuits provided with system ground and may include features of additional circuit protection from overload, short circuit, surge, and miswire. The current invention involves electronic circuits, components, hardware, and software code integrated into one device to provide total circuit protection from electrical faults.

Although commercial products have not specifically addressed glowing connection faults, it is included in the current invention as it is a major cause of electrical fires and equally important as other major faults currently addressed by certain regulatory mandates. The following patents relative to glowing connection are cited herein for reference on prior arts distinguishing them from the current invention:

In the prior art, (U.S. Ser. No. 13/440,243, Shea)—is disclosed a method and apparatus for detecting a glowing contact applying at least two different resistance values across the power circuit and responsively sensing at least two voltages across said power circuit. This method of detecting glowing contact in the power circuit involves determination if the changes in the sensed voltages is linear within a predetermined range or if a change in the sensed voltages does not increase with a decrease in resistance values. This is different with that of Tomimbang's current invention in that Shea's method uses different principle and that it addresses glowing connection as it occurs rather than having a pre-emptive method to detect the build-up of glowing connection.

Also in the prior art (U.S. Pat. No. 6,707,652 B2, Engel)—is disclosed an electrical switching apparatus including glowing contact protection where an electrical switching device includes a line circuit having a first temperature, a neutral circuit having a second temperature, and a load terminal and separable contacts adapted to electrically connect the line circuit and the load terminal. A first diode temperature sensor outputs a first signal representative of the first temperature of the line circuit and a second diode temperature sensor outputs a second signal representative of the second temperature of the neutral circuit. A circuit determining a difference between the first and second signals provides the trip signal. This is completely different from that of Tomimbang's invention in that the glowing connection protection feature is included as part of other fault detection systems. The principle of using temperature sensors and using the data to address glowing connection detection in Tomimbang's invention is completely different from that of Engel's invention.

BRIEF SUMMARY OF THE INVENTION

The current invention is directed to an apparatus, system and method for detection and interruption of a multitude of electrical faults and is hereinafter referred to as TPCI, which integrates multiple electrical circuit faults protection into one, utilizing common elements to have a unified circuit, apparatus or system performing all the different functions of otherwise a multitude of elements, circuit, systems and apparatus. Instead of having separate protective devices for specific or a limited number of electrical faults, the TPCI provides protection for all the different faults into one device, utilizing common components including microcontroller, switching and tripping mechanisms, sensors, among all others as disclosed herein, thereby offering total circuit protection from electrical faults.

The current invention includes a system and method to enable the TPCI to operate even when connected in circuits with or without ground. This system can be used and incorporated into wiring devices and other apparatus such as and including Ground Fault Circuit Interrupters (GFCI or GFCIs) and Arc Fault Circuit Interrupters (AFCI or AFCIs) to enable them to detect faults when connected in circuits with or without a system ground. AFCIs and GFCIs as a standard are typically used on circuits provided with system ground and may include features of additional circuit protection from overload, short circuit, surge, and miswire. The current invention involves electronic circuits, components, hardware, and software code integrated into one device to provide total circuit protection from electrical faults.

Although commercial products have not specifically addressed glowing connection faults, it is included in the current invention as it is a major cause of electrical fires and equally important as other major faults currently addressed by certain regulatory mandates. The following patents relative to glowing connection are cited herein for reference on prior arts distinguishing them from the current invention:

BRIEF DESCRIPTION OF THE DRAWINGS

FIG. 6 is an illustration of the different types of current sensors used in the TPCI in accordance with the embodiments of the current invention.

FIG. 7 is a top view of a portion of a receptacle outlet as an exemplification of the ways temperature sensors for glowing connection and overload protection systems can be mounted to a TPCI, and in accordance with the embodiments of the current invention.

FIG. 7B is an isometric view of a portion of a receptacle outlet as an exemplification of the ways temperature sensors for glowing connection and overload protection systems can be mounted to a TPCI, and in accordance with the embodiments of the current invention.

FIG. 8C is another sample circuitry exemplifying ways temperature sensors can be configured for glowing connection and overload protection in accordance with the embodiments of the current invention.

DETAILED DESCRIPTION OF EMBODIMENTS

Figure 1:
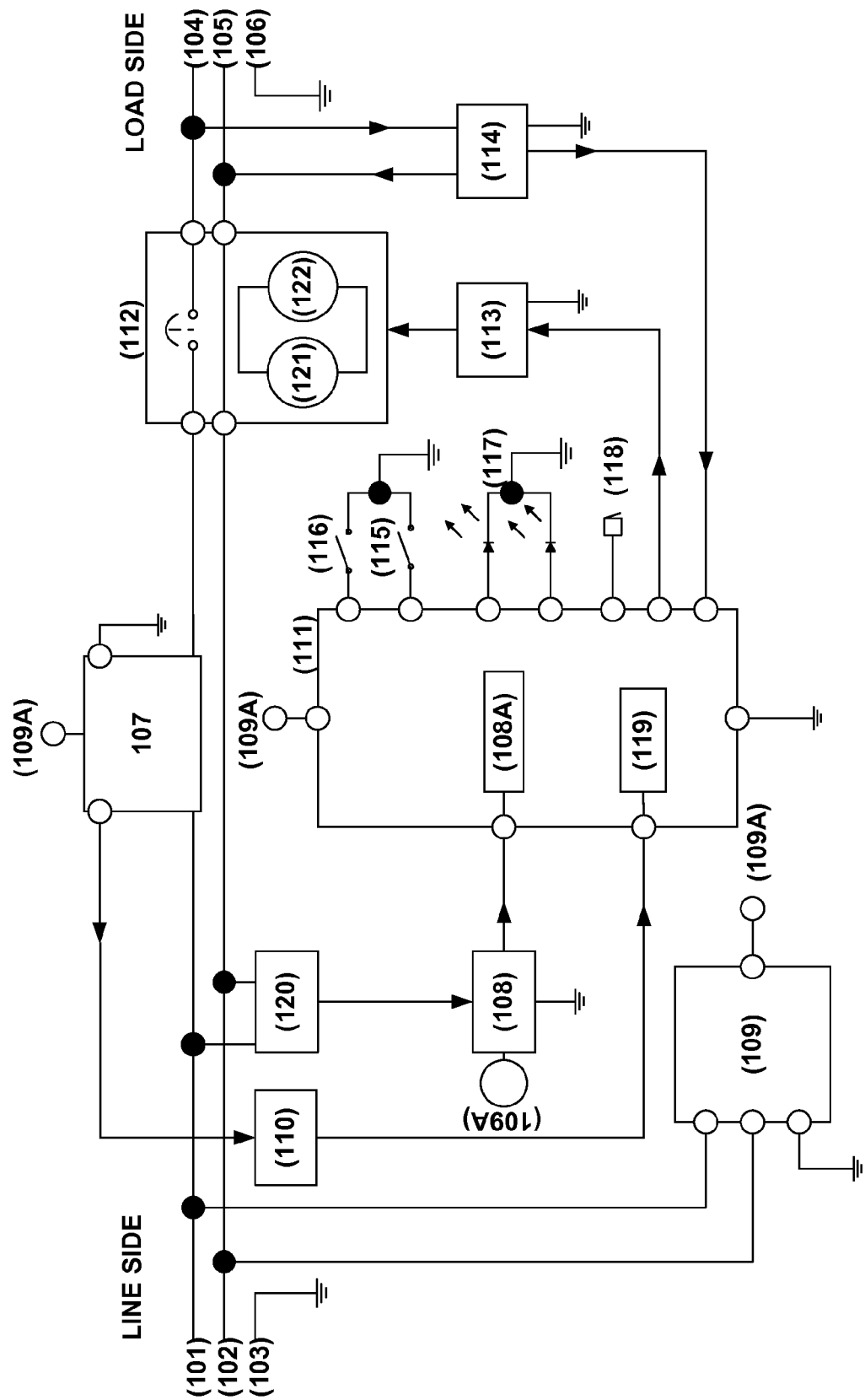
FIG. 1 is a system block diagram of a single-phase AC arc fault circuit interrupter (AFCI) in accordance with the different embodiments of the current invention.

References will now be made in detail to describe the different embodiments of the current invention, which are illustrated in the accompanying drawings. Specific details disclosed herein are not to be interpreted as limiting, but rather as a basis for the claims and teaching one skilled in the art how the current invention can be employed in any appropriately detailed system, structure or manner. Wherever possible, the same reference numbers and symbols are used throughout the drawings to refer to the same or like components, circuits or functions.

For the purposes of this invention, the following terms are defined and used as follows:
a) AC—in electrical terms, this refers to alternating current
b) DC—in electrical terms, this refers to direct current
c) ADC or ADCs—analog to digital converter or converters, and when used with the term "signal', it typically refers to an analog input to a microcontroller ADC channel
d) AFCI or AFCIs (in singular or plural form)—commonly known as Arc Fault Circuit Interrupter or Interrupters
e) GFCI or GFCIs (in singular or plural form)—commonly known as Ground Fault Circuit Interrupter or Interrupters
f) LINE WIRE—also known as HOT or LIVE wire
g) NEUTRAL WIRE—also known as COLD wire is a circuit conductor which has literally the same potential as ground.
h) MICROCONTROLLER—also known as MCU, or a small computer Integrated Circuit with processor, memory and programmable input and output peripherals. It has been referred to as microprocessor in Tomimbang's prior patents.
i) TRIP or TRIPPED—term to indicate a contactor or switch position being OFF, a button designation for OFF position, turn OFF or turned OFF, switch or switched OFF.
j) RESET—term to indicate a contactor or switch position being ON, a button designation for "ON" position, turn ON or turned ON.
k) OPTOCOUPLER—also called an optical coupler, is a digital isolator which is an electronic device for switching an isolated circuit. It is similar in function to optotriac, phototransistor, or photodiode.
l) SCR or SCRs (in singular or plural form)—SILICON CONTROLLED RECTIFIERS or solid-state switchers reacting to the flow of current to switch a circuit ON or OFF.
m) PROPERLY WIRED—in relation to a circuit, equipment or wiring device, means that the LINE-SIDE LINE wire is connected to the LINE-SIDE LINE terminal, the LINE-SIDE NEUTRAL wire is connected to the LINE-SIDE NEUTRAL terminal, the LOAD-SIDE LINE wire is connected to the LOAD-SIDE LINE terminal, and the LOAD-SIDE NEUTRAL wire is connected to the LOAD-SIDE NEUTRAL terminal. Additionally, for grounded circuits, this means that the GROUND wire is connected to the GROUND terminal.
n) LINE-SIDE—means that part of an electrical circuit, equipment or device which is intended for connection to the main power supply.
o) LOAD-SIDE—means that part of an electrical circuit, equipment or device which is intended for connection to the LOAD.
p) SOLENOID-ACTUATED—also means electromagnetically-actuated, pertains to the method of actuating the RESET and/or TRIP mechanism of an electrical or electronic protective or control device such as and including contactors and relays which are used in AFCIs, GFCIs and TPCIs in different types and forms. When the term electromagnetic is used in conjunction with a TRIP or RESET mechanism or action, it means solenoid-actuated.

q) SOLENOID—refers to an assembly mainly consisting of wires wound on a core to produce a uniform magnetic field, and a plunger which is actuated by the magnetic field which attaches to a fixture for locking or unlocking RESET or TRIP mechanisms such as those of a contactor or relay.
r) LED—refers to Light Emitting Diodes which are available in different colors and are used for visual annunciation.
s) LCD—refers to Liquid Crystal Display for alphabetic, numeric or alpha-numeric annunciation.
t) NO—for auxiliary contacts, mean Normally Open
u) NC—for auxiliary contacts, mean Normally Close.
v) PRESS or PRESSED—refers to switching of contacts by pressing a button
w) CODE—also termed software, or program, or software code, or software program, when used with and in reference to a microcontroller means the program that receives its input and drives its processing functions and output peripherals. It is also defined as computer instructions and data definitions expressed in a programming language or in a form output by an assembler, compiler, or other translator. Code driven means the same as software driven, indicating a function being executed by software or code routines.
x) System Ground or Earth—also termed ground, means the ground point in an electrical system that provides the lowest voltage-reference point. It is typically connected to a power-line ground, a ground rod, or in some cases, metallic water pipe line. An earth ground is not intended to carry current. The system ground serves as the main connection to ground on the line side of protective devices.
y) Digital Ground—A common 0-Voltage (zero voltage) or ground reference for digital circuits. Digital ground and analog ground systems are typically wired separately to avoid introducing digital noise into the analog circuit or vice versa, and may be connected together through a coupling circuit designed to avoid interference between each other.
z) Analog Ground—The point in an electronic system or circuit that serves as a reference ground for analog circuits. Digital ground and analog ground systems are typically wired separately to avoid introducing digital noise into the analog circuit or vice versa, and may be connected together through a coupling circuit designed to avoid interference between each other.
aa) Floating Ground System—a system wherein a circuit or device operates without a system ground
ab) GLOWING Connection—also called glowing contact, is a phenomenon where two series connections or contacts in a circuit get fused and typically remain red hot building up heat energy high enough to cause fire or damage to surrounding materials. Glowing connection is generally brought about by unstable or loose wire terminations and connections. Although considered a separate electrical fault, it starts as variants of arc faults until the actual glowing connection event. Commercial wiring devices do not typically provide protection from this phenomenon.

FIG. 1 is a block diagram of a single-phase 120V Arc Fault Circuit Interrupter (AFCI) disclosed in Tomimbang patent application Ser. No. 13/528,809 on Jun. 20, 2012 and patent application Ser. No. 13/274,291 on Oct. 14, 2011, now U.S. Pat. No. 8,817,431B2 in accordance with the different embodiments of the current invention. This AFCI comprises of Line-Side terminals Line/Neutral/Ground 101/102/103, Load-Side terminals Line/Neutral/Ground 104/105/106, a Hall Effect Current Sensor Integrated Circuit (HECS) 107, a HECS measurement phase shift correction circuit 108 and anti-alias filter and buffer amplifier circuit 110 with analog output to microcontroller 111 ADC port 119.

The apparatus further consists of a regulated power supply circuit 109 with DC voltage output or outputs 109A which supplies all power-driven components of the AFCI circuit, a microcontroller 111 loaded with a code with all the peripherals to receive and process signals and output data, a trip and reset mechanism or contactor 112 with trip and reset solenoids 121/122, a trip and reset switching circuit 113, a contactor 112 trip and reset position sensing circuit 114, reset 115 and test 116 switches, a voltage divider circuit 120 for voltage reference and to insure that there is a means for line synchronization of the HECS 107 measurements with the line voltage regardless of whether or not there is a system ground for reference or when the connections to the line-side-line 101 and line-side-neutral 102 connections are reversed, visual indicator 117 and audible indicator 118 for annunciation of system and diagnostic conditions, a software or code, and the associated electrical, mechanical, electro-mechanical and electronic components and interconnections to render the apparatus or system complete and operational.

The illustration in FIG. 1 of a single-pole contactor 112 is a representation of a single-pole switching device or contactor but one skilled in the art recognizes that the same principle is applicable to 2-pole contactors or that of any number of contacts and combinations as necessary. Anyone skilled in the art also recognizes that using the same principles herein, it is also applicable to multi-phase systems. Contactor 112 is also a general representation of a contactor with solenoid-operated trip and reset mechanisms 121/122 but anyone skilled in the art also recognizes that using the same principles laid down herein, the reset mechanism can have either a manual or solenoid-operated switching mechanism, and wherein the solenoid operation is driven by SCRs or thyristors, or other switching devices. For a contactor 112 with manual reset and solenoid operated trip mechanism, only the trip uses a solenoid 121 and reset is through a manually activated mechanical latch integrated within the contactor 112 and therefore reset solenoid 121 is not necessary.

The AFCI comprises a combination of hardware and software systems utilizing a microcontroller 111 loaded with a code to monitor system conditions, detect arcs, trip the device when fault occur, and display system conditions accordingly.

When the contactor 112 is reset, the fault protected electrical circuit starts from the line side line conductor 101, goes through the HECS integrated circuit 107 and electromagnetic trip and reset mechanism or contactor 112 to the load side line conductor 104, then to a connected load and back to the load side neutral conductor 105, which is connected to the line side neutral conductor 102. In 2-pole contactor configuration, the line-side and load-side neutral are connected through the contactor 112 in the same manner as the line-side and load-side line. The system ground conductor 103 is connected throughout the AFCI grounding system. The DC power-driven components used throughout the system are powered by a switched-mode power supply (SMPS) 108 that operates over a specified range of input electrical power supply AC voltages and produces stable output DC voltages 109A.

The HECS integrated circuit 107 measures the electrical circuit current flowing through the line conductor 101/104 from the line side to the load side of the AFCI. The HECS integrated circuit 107 output voltages are proportional to the electrical circuit current load waveform with a stable output offset voltage. A HECS 107 measurement anti-alias filter 110 removes high frequency harmonics and noise from the HECS 107 ADC measurements. A HECS measurement phase shift correction circuit 108 connected to the microcontroller comparator port 108A is connected to the line side conductors 101/102 through a resistive divider circuit 120 to control the microcontroller fundamental frequency interrupt process that matches the phase of the HECS ADC measurements to the phase of the fundamental current frequency. The microcontroller 111 interrupt process uses a built-in comparator and software-adjusted HECS zero reference offset voltage value equal to the stable output offset voltage value of the HECS integrated circuit 107. The microcontroller 111 code detects electrical circuit arc, overload and short-circuit faults from digital analysis of the HECS ADC measurements.

When the microcontroller 111 program detects an electrical circuit fault, a trip command is sent to the trip and reset switching circuit 113 that interrupts the fault protected electrical circuit 104/105 by tripping the electromagnetic trip and reset mechanism or contactor 112. Visual 117 and audible 118 indicators for the electrical circuit fault are then enabled. When the system reset switch 115 is subsequently enabled, the microcontroller 111 code initializes values and disables fault indicators, checks for system miswire and end-of-life conditions by evaluating the trip and reset sensing circuit 114 and by sending trip and reset commands to the trip and reset switching circuit 113 to open and close the protected electrical circuit 104/105 with the electromagnetic trip and reset mechanism or contactor 112. When system reset checks have successfully completed, the protected electrical circuit 104/105 is kept closed until another electrical circuit fault is detected by the microcontroller 112 program.

The microcontroller 111 code include routines to detect system end-of-life conditions by both initially and periodically testing system components, and then as a result, the system interrupts the electrical circuit and enables visual 117 and/or audible 118 indicators. System end-of-life is determined by certain operating conditions including:

a) The microcontroller 111 clock counter reaching a predetermined lifetime limit set within the code.
b) The inability of the electromagnetic trip and reset mechanism 112 to engage contacts between the line side and load side. This is detected by a microcontroller 112 test code routine that determines if the contacts did not engage after the reset command is enabled, which could mean electronic or mechanical failure or both.
c) The inability of the electromagnetic trip and reset mechanism 112 to disengage contacts between the line side and load side. This is detected by a microcontroller 111 test code routine that determines if the contacts stay engaged after the trip command is enabled, which could mean electronic or mechanical failures or both.
d) Microcontroller 111 Watchdog timer, RAM parity check, and Cyclic Redundancy Check (CRC) failures.

When the system test switch 116 is enabled, the microcontroller 111 code checks that the electrical circuit fault detection and interruption algorithms are working properly by simulating specific electrical circuit faults, which result in trip and reset commands being sent to the trip and reset switching circuit 113. During the system test, the microcontroller 111 program checks the trip and reset sensing circuit 113 to validate that the protected electrical circuit 104/105 is being correctly opened and closed by the electromagnetic trip and reset mechanism 112. While the illustration is for an AFCI with electromagnetic trip and reset operation, one skilled in the art recognizes that the same system applies to an AFCI utilizing a contactor with an electromagnetic trip and a manual reset mechanism, wherein the reset function is not activated by the microcontroller 111 code but instead manually, however, the rest of the functions remain the same as that of an electromagnetic trip and reset AFCI.

Figure 2:
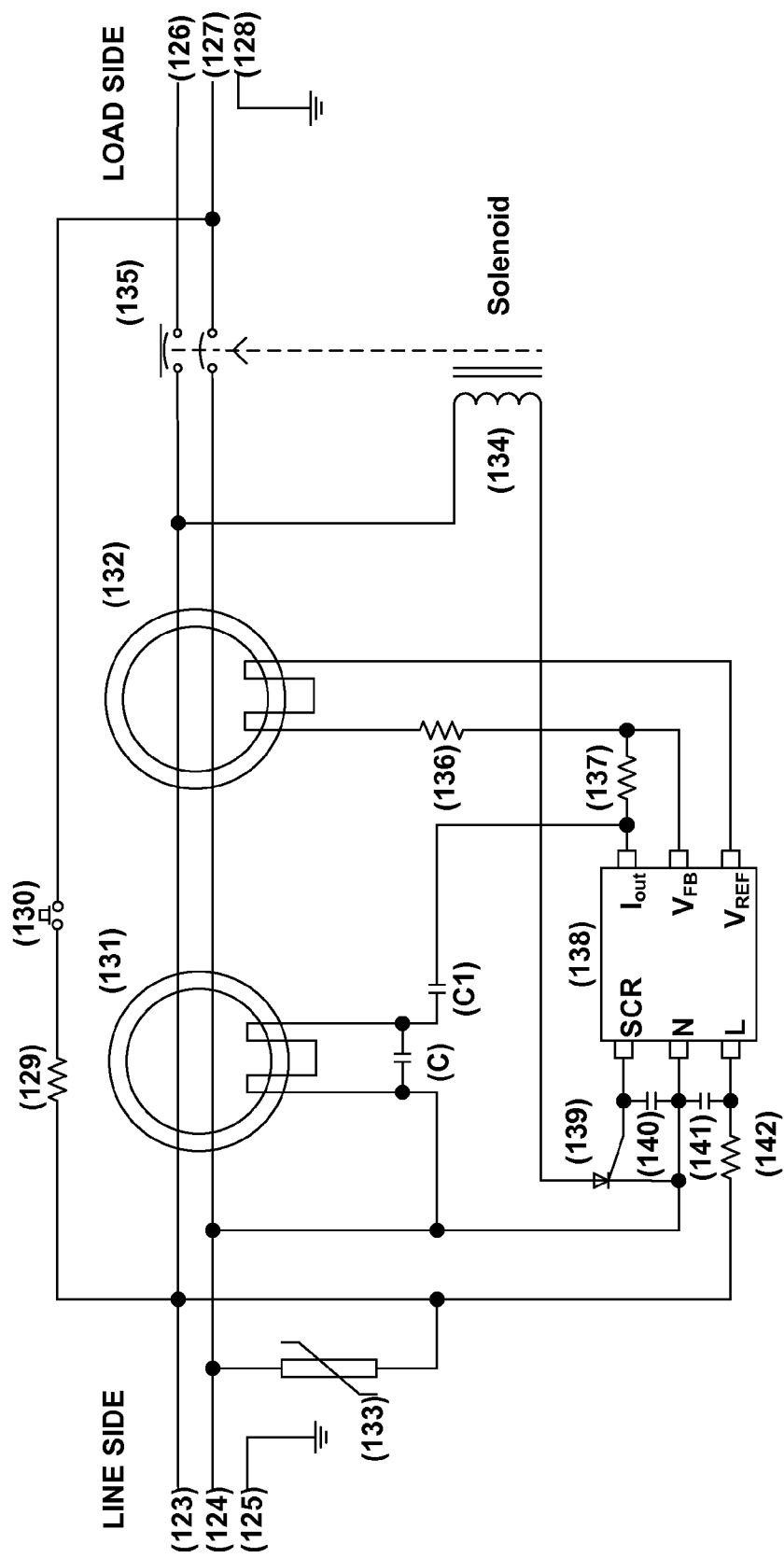
FIG. 2 is a circuit diagram of a typical single-phase AC ground fault circuit interrupter (GFCI) utilizing a conventional differential current sensor in accordance with the different embodiments of the current invention.

For exemplification purposes, FIG. 2 is a schematic diagram of a typical GFCI circuit utilizing a 2-coil differential current transformer sensor 131/132 with a commercial GFCI controller 138. Current sensor windings 131/132 are typically contained in the same enclosure. The circuit detects ground fault based on an imbalance between the current flowing through the Line-side Line and Neutral conductors 123/124 and load, which is not shown, which is connected through the load-side line 126 and neutral 127. Under normal conditions and without ground fault, the current through the Line-side line and neutral conductors 123/124 are typically the same that the magnetic flux around them cancel each other out, hence no differential current exists. Ground fault conditions generate a differential current from the magnetic flux difference between the Line and Neutral conductors which causes an oscillation in the current sensor generating a ground fault signal. This differential current is detected and processed by the GFCI controller 138, sending a signal to trigger the operation of a solenoid 134 to trip the contactor 135 that separates the Line-side line and neutral conductors 123/124 from the Load-side line and neutral conductors 126/127 of the GFCI. A test circuit consisting of a test button or switch 130 in series with a resistor 129 is used to simulate a ground fault to trip the contactor 135 as part of a routine integrity test for the GFCI. Capacitors 140/141/C/C1 and resistors 136/137/142 are passive components necessary to complete the ground fault controller circuit. A Metal Oxide Varistor 133 is used for surge protection and is typically connected across the Line-side Line and Neutral 123/124 conductors.

Figure 3:
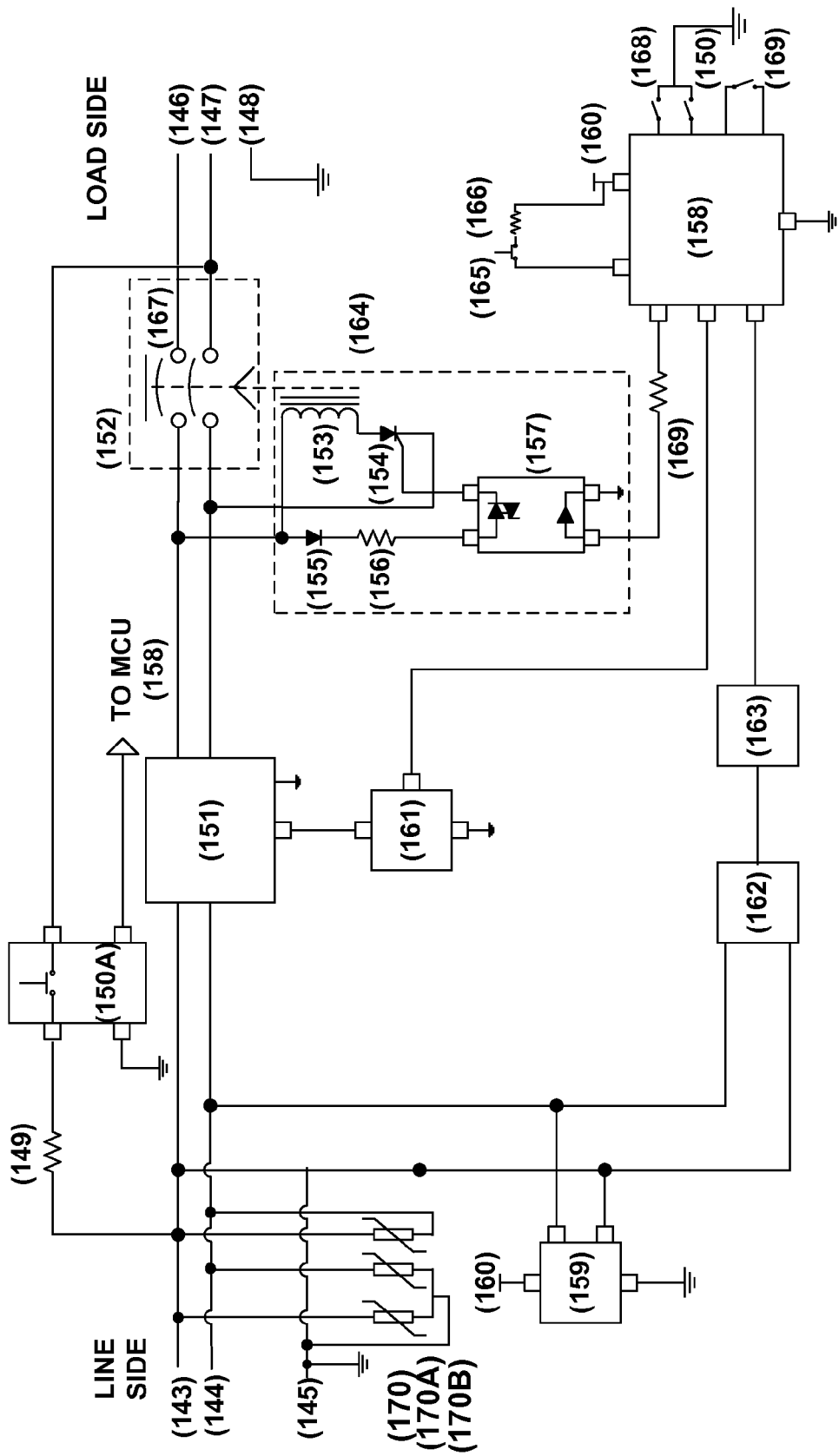
FIG. 3 is a diagram of a single-phase AC microcontroller-based ground fault circuit interrupter (GFCI) in accordance with the different embodiments of the current invention.

FIG. 3 discloses a microcontroller-based GFCI circuitry in accordance with certain embodiments of the current invention. This follows the same principle of the basic GFCI circuitry as outlined in FIG. 2 above, with the addition of a microcontroller 158 controlling the operation of the GFCI through an algorithm-based code. The magnetic flux produced in the Line and Neutral conductors 143/144 passing through the Differential Current Sensor 151 cancel each other out under normal circuit conditions or when there is no ground fault, indicating that the values are the same. When a ground fault occurs, the current through the line side line conductor 143 is different from that through the line-side neutral conductor 144, hence the presence of a differential current. This differential current is detected by the GFCI controller 161 which sends a signal to microcontroller 158 of a ground fault event, and accordingly the microcontroller 158 executes code routines to activate the tripping circuit 164 and trip the contactor 152. A digital isolator such as an optocoupler 157 is used to isolate the AC side of tripping circuit 164 from the DC circuitry of the GFCI.

The ongoing developments with ground fault current sensor technologies do not limit the type of sensors that can be used in the current invention, and one skilled in the art recognizes that using the same principles herein disclosed, other types and configurations of ground fault current sensors can be used to attain the same objectives of the current invention. Using the same principles laid down in the current invention, the Ground Fault Current sensor 151 can also be a magnetic differential hall effect current sensor integrated circuit which can be used to sense the differential current between the conductors in the event of a ground fault. Also, using the same principles laid down in the current invention, the Ground Fault Current sensor 151 can also be a differential Giant Magneto-resistive (GMR) current sensor integrated circuit which can be used to sense the differential current between the conductors in the event of a ground fault.

DC power to all the power driven components is supplied through a regulated power supply 159 operating in a specified range of AC input voltages with a stable DC output voltage or voltages 160. A resistive divider circuit 162 allows acquisition of line signal for zero-cross reference for tripping the contactor 152 when a ground fault occurs. The resistive divider 162 being connected across line 143 and neutral 144 rather than the line 143 and the system ground 145 enables the GFCI to operate even in systems without ground and regardless whether or not the line and neutral connections 143/144 are reversed. A digital isolator 163 such as an optocoupler isolates the AC from the DC side of the zero-cross circuitry. When a ground fault occurs, the microcontroller 158 drives the trip circuit 164 where the SCR 154 activates the solenoid 153 to trip the contactor 152.

The circuit is protected from surge by varistors 170/170A/170B across the Line, Neutral, and Ground connections 143/144/145. The trip circuit 164 consists of the SCR 154, solenoid 153, switching diode 155 and resistor 156. The digital isolator 157 isolates DC from the AC side of the trip circuit 164. Other components are passive and are necessary to complete circuit interconnections.

By having the ground fault signal processed by the microcontroller 158 rather than relying solely on the ground fault controller 161 as with current commercially available GFCIs, it gives another level of protection to minimize the possibility of a false or nuisance trip which is prevalent with existing commercially available products. A microcontroller-based GFCI operation also provides a means to trip the contactor 152 at or near the zero-crossing of signals for reduced current on tripping, thereby extending the life of the contactor 152. A microcontroller-controlled GFCI operation also makes it possible to integrate ground fault protection with any other electrical fault protection systems. Furthermore, the miswire protection circuit of the TPCI can be integrated into the GFCI, with microcontroller 158 code routines to include the miswire protection feature. Furthermore, glowing connection protection system can be integrated into the GFCI by incorporating the temperature sensor circuit 200 according to the embodiments of the current invention. The miswire protection herein disclosed is multi-use, which remains operational even when the GFCI disclosed herein is disconnected and transferred from one circuit to another. This is unlike other commercial GFCIs where their miswire protection is one-time use only such that a component is permanently disabled after first usage, thereby making said other commercial GFCIs unable to detect miswire if the GFCI is taken out from an active circuit and re-installed elsewhere.

A regular self-test routine is included in the microcontroller 158 code that checks for circuit integrity by continuously monitoring for end-of-life conditions including a pre-determined life cycle, microcontroller 158 watchdog, RAM parity check, and cyclic redundancy check failures. When any of said end-of-life conditions occur, a code routine trips the contactor 152 and activates a visual 168 and/or audible 169 signal to annunciate the event.

Reset button 167 is used to manually reset the contactor 152. The contactor 152 may alternatively be a double-solenoid contactor where the tripping and switching mechanisms are each provided with a solenoid to automatically trip and switch the contactor through the microcontroller 158. The contactor 152 may alternatively be a retractable single solenoid latching contactor where the tripping and switching mechanisms are controlled by the same solenoid to automatically trip and switch the contactor through the microcontroller 158.

To satisfy a UL standard requirement, the GFCI disclosed herein has a code-managed periodic self-test routine separate from its afore-mentioned regular self-test routine which is conducted at specified intervals. To implement this periodic self-test routine, the GFCI utilizes its test circuit 149/150A. The isolator switcher 150A can be an optocoupler, a relay, or similar switching devices that can be operated through the microcontroller 158. The periodic self-test routine is part of the microcontroller 158 code that controls the operation of the GFCI disclosed herein. When the periodic self-test routine is implemented, the test code routine using the test button 150 is momentarily suspended, the isolator switcher 150A is powered up by the microcontroller 158 thereby creating a ground fault event which will be detected by the microcontroller 158. Since at this instance, the test button routine is suspended, instead of tripping the contactor 152, a signal is implemented to indicate a successful periodic self-test and a working ground fault detection system, and the microcontroller 158 code continues with its cycles of operation. If the periodic self-test fails, then it will be indicated as an end-of-life situation and the contactor 152 trips with annunciation. When the contactor 152 is either a double-solenoid or a retractable single-solenoid contactor mentioned above, actual tripping and consequential resetting of the contactor can be done during the periodic self-test if it is desired to check the actual integrity of the contactor operation as well.

Figure 4:
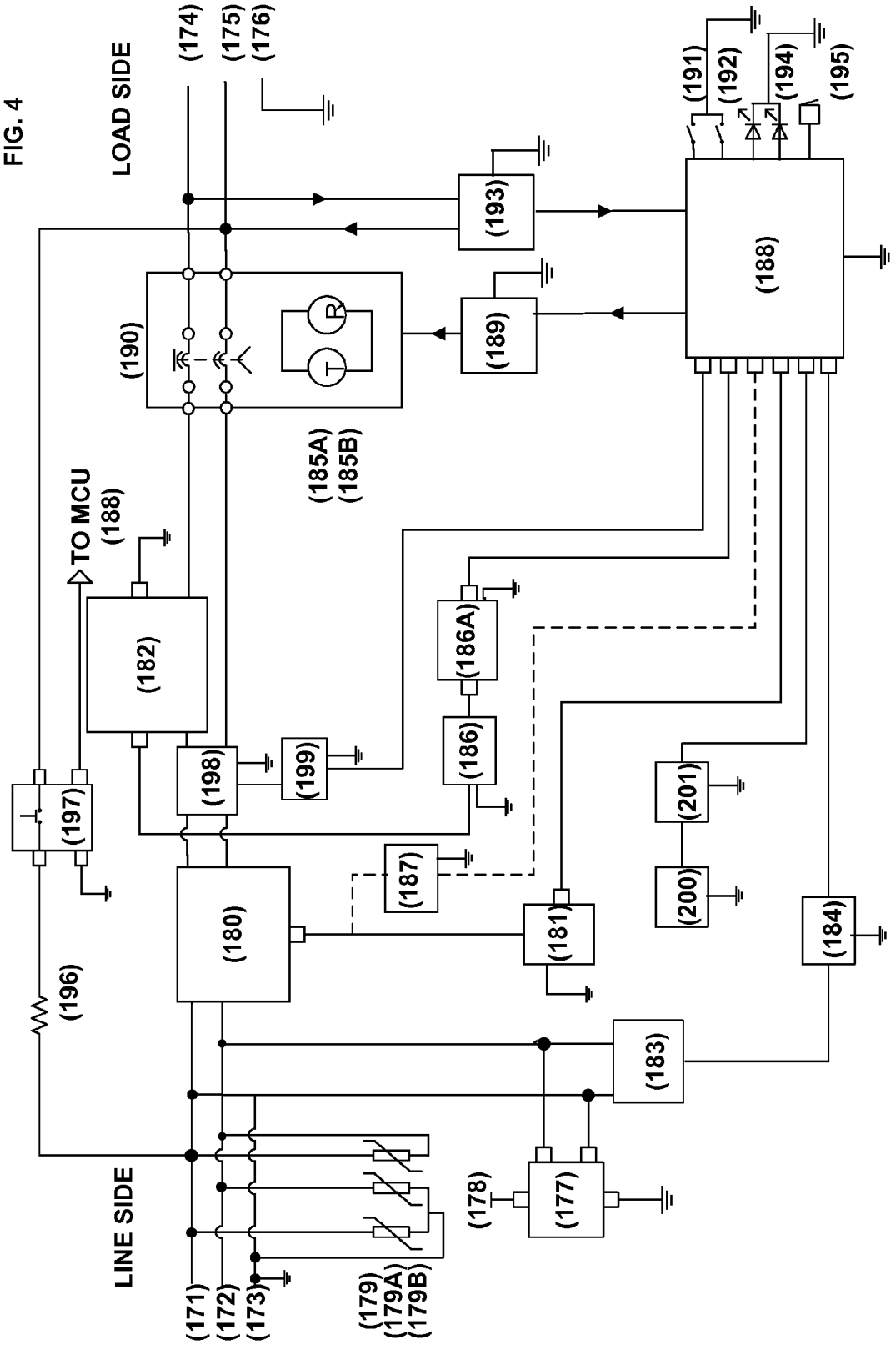
FIG. 4 is a block diagram of a single-phase TPCI utilizing a ground fault Current Sensor for ground fault detection, a potential transformer for detecting overvoltage and undervoltage conditions, and a multi-purpose Current Sensor for circuit monitoring and detection of arc and other electrical faults in accordance with the different embodiments of the current invention.

FIG. 4 is a block diagram of a single-phase AC TPCI in accordance with the different embodiments of the current invention. This is an apparatus, system and method for electrical circuit fault detection and interruption which operates on a power system with ground and also without ground, integrating an arc fault circuit interrupter (AFCI) with Ground Fault Circuit Interrupter (GFCI) and other fault detection circuits and systems into one apparatus, system, and method to detect the occurrence of a multitude of electrical faults that include series and parallel arcs, ground and leakage current faults, surge, miswire, overload, short circuit, glowing connections, overvoltage, and undervoltage, in DC, and AC, single and multi-phase systems, and interrupt the circuit when any of said faults occur, all of said fault detection systems being monitored and controlled by a single microcontroller. Phase loss protection is included when the invention is applied on multi-phase systems. With the different sensors used with the TPCI, practically, all kinds of electrical data can be acquired and processed by the microcontroller to detect and interrupt all kinds of electrical faults in the protected circuit, hence the current invention is titled as such.

For the purposes of this invention, the term arc fault can be either a series or parallel arc, and ground fault can be any form including a fault between line and ground, or neutral leakage to ground.

The TPCI is built into a housing in the form of a circuit breaker, a receptacle, a receptacle outlet, a convenience outlet, a cord attachment plug, a portable multiple outlet strip, or integrated into any other housing, apparatus, system or method.

The TPCI comprises the following circuits and components integrated to perform as a unitary apparatus, system, and method:

line and load-side terminal connections 171/172/173/174/175/176
a regulated DC power supply 177 with DC outputs 178
surge protection circuit elements 179/179A/179B
a ground fault current sensor (GFCS) 180
a GFCI controller 181
a GFCS signal conditioning circuit 187
a Ground Fault test circuit 196/197
a Multi-purpose Current Sensor for arc and other electrical faults (MPCS) 182
a MPCS measurement phase shift correction circuit 184
an anti-alias filter 186 and buffer amplifier circuit 186A
a resistive divider 183
a microcontroller 188
a potential transformer (PTX) 198
a PTX output signal conditioning circuit 199
a temperature sensor circuit (TSC) 200
a temperature sensor data converter and integration circuit 201
a test and reset switching circuit 189
a test and reset mechanism or contactor 190
test and reset solenoid coils 185A/185B
a trip or test switch or button 191
a reset switch 192
a Contactor position sensing circuit 193
Visual indicators 194
Audible indicators 195
a software program or code The line and load-side wiring terminal connections 171/172/173/174/175/176 are the means for the TPCI to get connected to the power supply and the load. These are standard components and used in a manner according to specific TPCI application or system. These wiring connections use screw 208 (shown in FIG. 7) or other alternative mounting fasteners to secure the wires with the mounting studs 209 (shown in FIG. 7) that serve as connections to the TPCI. On the mounting studs 209 for the line and neutral connections 171/172/174/175 or within their vicinity, temperature sensors 210/211/212/213 (shown in FIG. 7) for glowing connection and overload detection can be mounted. The sensors 210/211/212/213 can also be mounted on the Line and Neutral stampings that make contact with external devices such as plugs.

The regulated DC Power Supply 177 is a switched mode power supply operating in a specified range of AC input voltages with stable DC output voltage or voltages 178 to operate the DC-powered circuits and components of the TPCI. This switched mode power supply utilizes a rectifier circuit, a high frequency switcher, filtering components and voltage regulator or regulators for stable output voltage or voltages. A switched mode transformer can be used with the DC power supply 177 circuit as an option. This power supply 177 is connected to the line-side of the TPCI 171/172/173 to insure that the detection system is always on when power supply is on, regardless if the contactor 190 is off. Alternatively, a second set of rectifier circuit similar to the one connected at the line side is connected on the load-side of the TPCI in parallel with it, and this applies when the TPCI is required to detect all types of miswire conditions, and not only line-load miswire where the second rectifier circuit is not required. This was disclosed in Tomimbang's patent application Ser. No. 13/528,809 filed on Jun. 20, 2012 which is referred to as part of the current invention. The miswire protection herein disclosed is multi-use, which remains operational even when the TPCI is disconnected and transferred from one circuit to another. This is unlike other commercial protective devices where their miswire protection is one-time use only where a component is permanently disabled thereby making said protective devices unable to detect miswire if they are taken out from an active circuit and re-installed elsewhere.

The surge protection circuit elements 179/179A/179B is herein disclosed for exemplification purposes as a set of Metal Oxide Varistors (MOVs), commonly called varistors connected across the Line, Neutral, and Ground 171/172/173, which are appropriately rated to sustain surges on the TPCI, typically from lightning, or any other external surge sources. While varistors are used herein for exemplification purposes, one skilled in the art recognizes that other components can be used to serve the same surge protection purposes as this invention.

The ground fault current sensor (GFCS) 180 is a differential current sensor such as the one referred to in FIG. 2 as 131/132. Ideally, in the absence of a ground fault the current flowing through the line-side line 171 is the same as through the line-side neutral 172. The current flowing through the line 171 passes through the GFCS 180 to the load (not shown) then back through the neutral 172. The magnetic field produced around the line 171 and neutral 172 conductors through the GFCS 180 cancel each other out when there is no ground fault, as an indication that the values are the same, and therefore a healthy circuit. In case of a ground fault, the current through the line 171 passing through the ground fault sensor 180 is different from that through the neutral 172, hence the presence of a differential current. The GFCS 180 senses an imbalance in current flow between line and neutral 171/172 when a ground fault occurs, and outputs a low level analog signal to the GFCI controller 181 for processing and determination of a ground fault. The GFCI controller 181 output is received by the microcontroller 188 and executes its ground fault code routine then activate the TPCI trip and reset circuit 189 to trip the contactor 190. The GFCS 180 disclosed in this invention as a 2-coil differential ground fault current sensor is only for exemplification purposes, however, anyone skilled in the art recognizes that various developments in differential current sensor technologies can lead to many variants of the same sensor to satisfy the requirements of the current invention. Using the same principles of the current invention, the Ground Fault Current sensor 180 can also be a differential hall effect current sensor integrated circuit which may be used to sense the differential current between the conductors in the event of a ground fault. Also, using the same principles laid down in the current invention, the Ground Fault Current sensor 180 can also be a differential Giant Magneto-resistive (GMR) current sensor integrated circuit which can be used to sense the differential current between the conductors in the event of a ground fault. These sensors, owing to their compact size and advanced electronics when compared to the traditional 2-coil differential current transformer, will not only offer space saving in the layout of TPCI components, sensing accuracy and reliability in performance, but also cost savings as they can interface with the microcontroller 188 thereby eliminating the need for a GFCS controller 181.

The GFCI controller 181 is similar to the one referred to in FIG. 2 as GFCI controller 138. It is a commercially available controller integrated circuit which processes the low level signal from the ground fault current sensor 180 and outputs a signal to the microcontroller 188 to execute its ground fault detection routines. One skilled in the art recognizes that in lieu of the GFCI controller 181, a signal conditioning circuit 187 can receive the signal from the GFCS 180 output and condition it to become suitable for processing by the microcontroller 188 according to its code routines for ground fault detection.

The ground fault test circuit is composed of a resistor 196, and isolator switcher 197. When the test button 191 is pressed, the microcontroller activates isolator switcher 197 where then current flows between the line 171 and load side neutral 175, bypassing the GFCS 180. This results in a current imbalance on the GFCS 180 that would be detected as a ground fault by the GFCI controller 181 and transmitted to the microcontroller 188 which then executes a code routine to trip the contactor 190, identify, and annunciate the fault through audible and visual means.

The multi-purpose current sensor (MPCS) 182 monitors the circuit current flowing through the Line-Side Line conductor 171 and load, and its measurements are converted into proportional output voltages while retaining the line current electrical characteristics for fault detection. The MPCS 182 comes in different types, shapes, forms and methods of mounting in relation to the line conductor, as illustrated in FIGS. 5, 5A, 6 and 6A. The MPCS 182 output signals are digitally analyzed by the microcontroller 188 according to its code routines for the detection of arcs, surge, miswire, overload, short circuit, glowing connection, and for monitoring and power calculation functions. An alternative current sensor MPCS 182 is also disclosed herein as a linear step down current transformer or a current transducer wherein a voltage on the secondary winding ratiometric to the line current is derived by shunting a resistor. Although this linear step-down current transformer is also used for current sensing for other applications such as metering and instrumentation, it is not used in Arc Fault detection systems as disclosed in the current invention. The outputs of the MPCS 182 are ratiometric or proportional to the line current while retaining the line current electrical characteristics for fault detection. Anyone skilled in the art recognizes that the same principles laid down herein can be applied to multi-phase systems, in which case the MPCS 182 is required in each phase.

The MPCS 182 phase shift correction circuit 184 provides synchronization of the MPCS 182 measurements with the line signal. This phase shift correction circuit 184 connected to the microcontroller comparator is connected to the line side conductors 171/172 through a resistive divider circuit 183 to control the microcontroller 188 fundamental frequency interrupt process that matches the phase of the MPCS 182 ADC measurements to the phase of the fundamental current frequency. The microcontroller 188 interrupt process uses a built-in comparator and software-adjusted MPCS 182 zero reference offset voltage value equal to the stable output offset voltage value of the MPCS 182. The phase shift correction circuit 184 being connected to the line side of the TPCI through the resistive divider 183 across Line and Neutral 171/172 is a means to insure that voltage reference is always available for line synchronization without depending on a ground connection and regardless of a reversed Line and Neutral connection. A buffer amplifier 186A is used to control the microcontroller 188 fundamental frequency interrupt process to match the phase of the MPCS 182 measurements to the phase of the line signal. The anti-alias filter 186 removes high frequency harmonics and noise from the MPCS 182 measurements. The MPCS 182 output signal is conditioned through this filter 186 and buffer amplifier 186A to become suitable for processing by the microcontroller 188 for the detection of arc faults, overload, glowing connection, short circuit, and surge, as well as for monitoring system conditions, power monitoring and metering calculations. One skilled in the art recognizes that alternatively, the buffer amplifier 186a and filter 186 functions may be incorporated with the MPCS 182 circuitry, thereby making it possible to eliminate them as additional components of the TPCI.

The microcontroller (MCU) 188 is adequately equipped with ADCs (analog to digital converters), DACs (digital to analog converters), RAM (random access memory), Flash memory, I/Os (input/outputs) and other standard peripherals to receive and process signals, output data and drive external devices according to the TPCI requirements for the detection of all of the aforesaid electrical circuit faults, monitoring system conditions power monitoring and calculations. The MCU 188 is also equipped with self-test features including CRC (cyclic redundancy check), RAM parity check, watchdog timer, and tamper-protection. Loaded with the TPCI software or code, the microcontroller 188 controls the operation of the TPCI, monitoring, receiving and processing signals and data from and to various circuit components, activating the trip and reset circuit 189 opening the contactor 190 when a fault occurs or when the trip button 191 is pressed, switching the contactor 190 when a solenoid operated one is used, identifying the faults that occur and output data to display the system conditions and provide diagnostic information, and activate a visual and/or audible annunciators 194/195. With addition of a wireless interface, the TPCI monitoring and diagnostic information can be remotely and wirelessly accessed and acquired, as well as receiving tripping or resetting commands. Wireless resetting of the TPCI is only possible where the contactor 190 has a solenoid activated trip and reset mechanism.

The step-down potential transformer (PTX) 198 is used to monitor the voltage across the line and neutral 171/172, and is rated higher than the operating voltage of the TPCI for a broader measurement and instrumentation. It is a low-current rated instrument-type step-down transformer with a low secondary voltage suitable for microcontroller-based circuits for the acquisition of data for the TPCI voltage monitoring functions. The output voltage of the PTX is scaled with the line voltage of the TPCI where minimum and maximum operating voltages are established for reference of normal operating conditions. The scaled output data range of minimum to maximum allowed voltages for the normal operation of the TPCI are defined within the microcontroller 188 code, allowing variations due to normal starting characteristics of certain electrical loads such as induction motors. The output signals of the PTX 198 passes through a conditioning circuit 199 to make them suitable for processing by the microcontroller 188 for the determination of line voltage conditions according to the TPCI code algorithms for overvoltage and undervoltage detection. The output signals of the PTX 198 is also an element for calculation of the circuit's power consumption which is managed within the TPCI code. For accurate power measurement, the actual voltage measured by the PTX 198 output together with the current measured by the MPCS 182, are managed within the microcontroller 188 code for power calculation and recording. When the line voltage exceeds the TPCI's maximum allowable voltage which is set in the TPCI code, or when the line voltage gets below the TPCI's minimum allowed voltage, a microcontroller 188 code routine accordingly flags the condition and sends a signal to the tripping circuit 189 to trip the contactor 190. A fault identifier and corresponding annunciation in the TPCI code routine will be activated. The PTX 198 output is also used by the microcontroller 188 code in the determination and annunciation of the occurrence of surge faults. While the surge protection circuit elements 179A/179B protect the circuit from the effects of surge, the PTX 198 provides the means for detection of the event, trip the circuit, identify and annunciate it according to the TPCIs surge fault detection code routines. When applied to multi-phase systems, PTX 198 is required across the lines to perform the same functions disclosed herein. The PTX 198 can be any form of voltage transducer wherein the output voltage, although reduced, still retains the signal characteristics of the primary voltage.

Figure 7A:
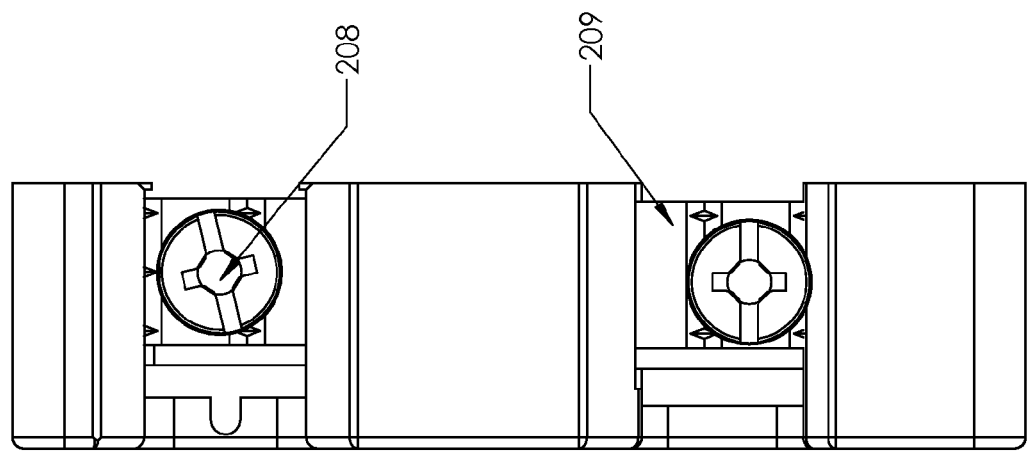
FIG. 7A is a side view of a portion of a receptacle outlet as an exemplification of the ways temperature sensors for glowing connection and overload protection systems can be mounted to a TPCI, and in accordance with the embodiments of the current invention.

The TPCI temperature sensor circuit 200 is used to trip the TPCI before a glowing connection can occur, and therefore is a fault-preventive system. Temperature sensor circuits are configured to provide signal or data to the TPCI for glowing connection and overload conditions. They can provide signal to the microcontroller 188 to detect glowing connection and overload conditions, or act as a switching implement to activate a control circuit to trip a contactor to isolate the load from the power supply line. The temperature sensor circuit 200 exemplified in FIGS. 8, 8A, 8B, 8C, 8D is composed of a variety of temperature sensors 210/211/212/213 strategically positioned within the TPCI where glowing connections could likely occur. For exemplification purposes, the temperature sensors 210/211/212/213 are shown in FIGS. 7, 7A, 7B representing top, side and isometric views inside a receptacle outlet, being representative of an apparatus provided with a solenoid-activated tripping circuit and contactor. The temperature sensors 210/211/212/213 are positioned at the terminal connections on 171/172/174/175 where wires are secured which is where glowing connections could likely occur, although they can be positioned anywhere else in the TPCI for specific protection and monitoring purposes. The sensors 210/211/212/213 are installed beside the mounting studs 209 to which the screws 208 that secure the wiring to the TPCI are mounted. For exemplification purposes, the sensors are installed on the printed circuit board (PCB) 214 that holds the mounting studs 209 such that the stud surface can conduct heat effectively to the temperature sensors 210/211/212/213. The sensors 210/211/212/213 can also be mounted directly to the mounting stud 209 or at any location within its sensing proximity. The sensors 210/211/212/213 can also be mounted at the line and neutral stampings that make contact with the plug blades when inserted into the outlet.

Figure 7C:
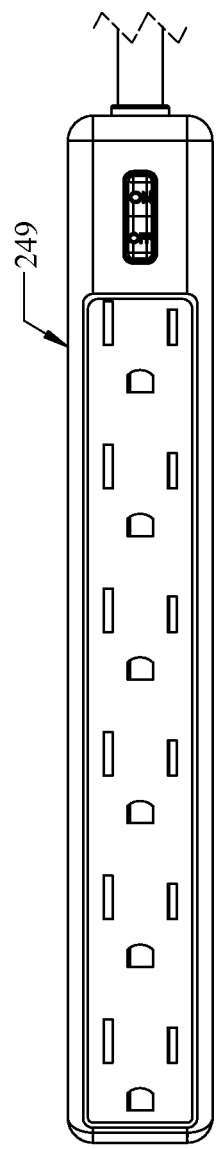
FIG. 7C shows a multi-outlet power strip as an example of a TPCI provided with temperature sensors for glowing connection and overload protection system, and in accordance with the embodiments of the current invention.
Figure 7D:
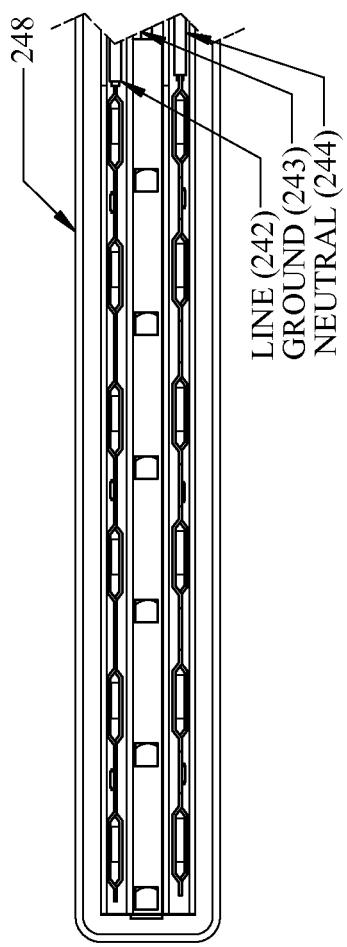
FIG. 7D shows the inside section of the multi-outlet power strip described in FIG. 7C with the Line, Neutral and Ground stampings and connections exemplifying ways temperature sensors for glowing connection and overload protection system can be mounted to a TPCI, and in accordance with the embodiments of the current invention.
Figure 7E:
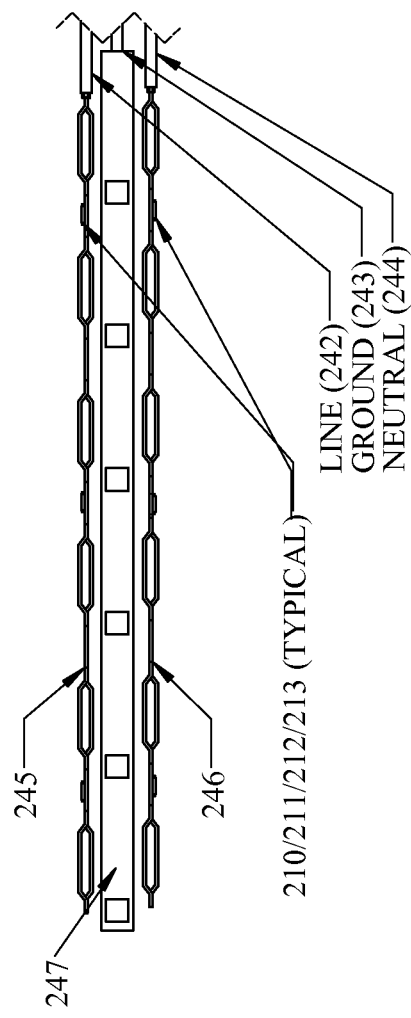
FIG. 7E shows the Line, Neutral and Ground stampings inside the multi-outlet power strip described in FIG. 7C exemplifying ways temperature sensors for glowing connection and overload protection system can be mounted to a TPCI, and in accordance with the embodiments of the current invention.

FIGS. 7C, 7D, 7E are illustrations of a multi-outlet power strip, being another representative of an apparatus provided with a solenoid-activated tripping circuit and mechanism or contactor where temperature sensors 210/211/212/213 are strategically positioned on the Line 245 and Neutral 246 stampings as most probable points where glowing connections could likely occur as they make contact with the blades of the plugs when inserted. With any manner of mounting, proper insulation is maintained between the sensors 210/211/212/213 and the mounting fixtures which is live with power when the TPCI is in use.

The test and reset switching circuit 189 interrupts the fault on the protected electrical circuit by tripping the contactor 190. When the system reset switch is subsequently enabled, the microcontroller 188 program initializes values and disables fault indicators, checks for system miswire and end-of-life conditions by evaluating the trip sensing circuit 193. When system reset checks have successfully completed, the protected electrical circuit 174/175 is kept closed until another electrical circuit fault is detected by the microcontroller 188 program.

The trip and reset mechanism or contactor 190 isolates the line 171/172 and load 174/175 sides of the TPCI. For exemplification purposes, FIG. 4 shows a contactor with separate solenoids 185A/185B for tripping and resetting the TPCI. The contactor 190 is equipped with two separate solenoids 185A/185B for trip and reset functions, in which case, the trip and reset switching circuit 189 controls both the trip and reset operation of the contactor 190. Alternatively, the contactor 190 can be a retractable single solenoid with a latching mechanism to control both the trip and reset operations by a single solenoid by alternately switching the contactor 190 on and off on every switching operation. One skilled in the art recognizes that various types of contactors can be used to attain the same objectives of the current invention by accordingly configuring the switching and tripping circuit 189 to fit the actual application.

The reset and trip switches or buttons 191/192 controls the state at which the TPCI is at, whether On or Off. On a manual reset contactor 190, the reset button is an integral part of the contactor and is mechanically latching to retain its position, whereas the trip button is an electrical switch as part of the electronic circuit which sends signal to the microcontroller 188 to execute a code routine to activate the trip circuit 189, triggering the solenoid to trip the contactor 190. With a contactor 190 provided with separate solenoid coils for trip and reset 185A/185B, the trip and reset buttons 191/192 are switches which are parts of the electronic circuit which sends signal to the microcontroller 188 to execute code routines to activate the trip or reset circuit 189, triggering a solenoid to trip or reset the contactor 190.

Figure 10:
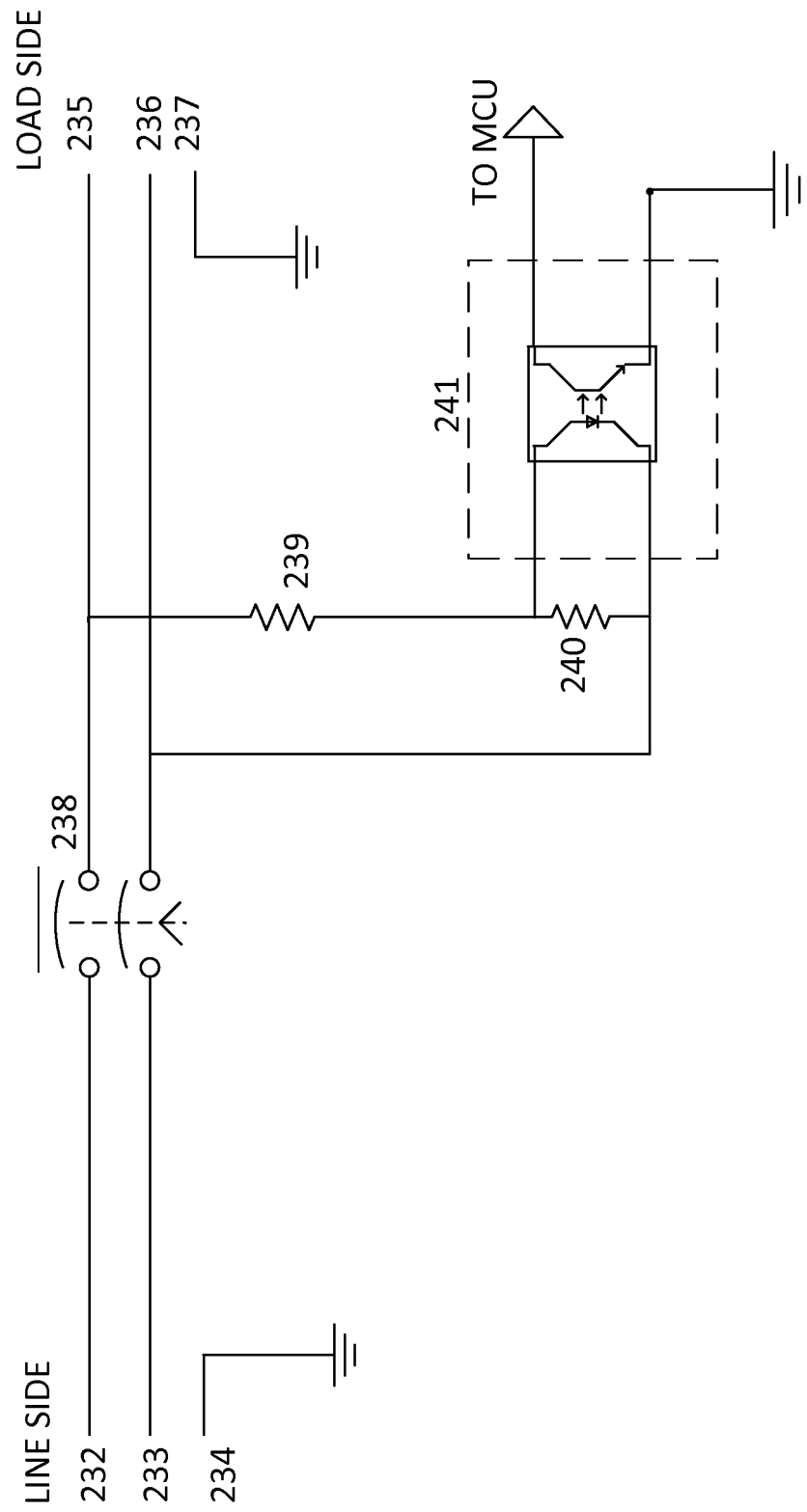
FIG. 10 is a partial schematic diagram from a TPCI circuitry showing the contactor position sensing circuit used for miswire detection and for specific end-of-life condition determinations in accordance with the embodiments of the current invention.

A contactor position sensing circuit 193 indicates the position of the contactor 190 whether it is in a trip or reset position equivalent to opening and closing of the electrical circuit. This circuit is illustrated in FIG. 10 and which was disclosed in Tomimbang patent application Ser. No. 13/528,809 filed on Jun. 20, 2012 which is made reference to and a part of the current invention. The contactor position sensing circuit 193 (shown in details in FIG. 10) is composed of a digital isolator 241 such as an optocoupler connected to the load side line and neutral 235/236 of the contactor 238 through a resistive divider 239/240. When the contactor 238 is reset, the octocoupler 241 is powered up and provides a signal to the microcontroller to indicate the contactor 238 position being ON. The signal from this sensing circuit 193 is used to validate end-of-life conditions for mechanical failure of the contactor to engage when reset button is pressed or to disengage when trip button is pressed. This sensing circuit 193 is also used in the miswire detection system of the TPCI to indicate when power is connected to the load side even when the contactor is in an off or disengaged position. In the case of contactor 238 with manual reset, a secondary indicator is required to verify contactor position and this is provided by an auxiliary switch (not shown) which can either be normally open (NO) or normally closed (NC) depending on how the switching code is configured, said auxiliary switch being integrated with the contactor 238.

The visual indicators 194 are activated as a result of the microcontroller 188 executing routines to indicate system, fault and diagnostic conditions. Faults are assigned specific LED switching frequencies to distinguish them from each other. Alternatively, the visual indicators are graphic displays controlled by the microcontroller to indicate system, fault and diagnostic conditions.

The audible indicators 195 are activated as a result of the microcontroller 188 executing code routines to indicate system, fault and diagnostic conditions. Faults are assigned specific frequencies and tones to distinguish them from each other.

The TPCI utilizes visual 194 and audible 195 indicators for system, fault and diagnostic conditions, and through TPCI code routines can use the combination of both or either one as needed.

The microcontroller 188 operates the TPCI with a software code designed to detect ground faults, arc faults, miswire conditions, glowing connections, surge, overload, overvoltage, undervoltage and short circuit; trip the circuit when fault occurs, annunciate system conditions, identify faults when they occur, and control the occurrence of nuisance or false trips resulting from normal operating characteristics of electrical loads that mimics electrical fault getting erroneously detected as arc faults. The code is also designed to perform a self-test that include circuit integrity, regulatory GFCI periodic self-test, and determination of end-of-life conditions, trip the circuit when self-test fails or when an end-of-life condition occurs, and annunciate the results. The TPCI is also designed to operate at different power line frequencies and the code includes determination of frequencies, implementing the applicable TPCI code routines accordingly.

The software code enables the microcontroller to detect system end-of-life conditions by both initially and continuously testing system components, and then as a result, the system interrupts the electrical circuit and enables visual 194 and/or audible 195 indicators. System end-of-life is determined by any of the following conditions:
  a) The microcontroller clock counter reaching a predetermined safe lifetime limit.
  b) The inability of the trip and reset mechanism 190 to engage contacts between the line side and load side of the TPCI. This is detected by a microcontroller 188 test code routine that determines that the contacts did not engage after the reset command is enabled, which could mean electronic or mechanical failure, or both.
  c) The inability of the trip and reset mechanism 190 to disengage contacts between the line side and load side of the TPCI. This is detected by a microcontroller 188 test routine that determines that the contacts stay engaged after the trip command is enabled, which could mean electronic or mechanical failure, or both.
  d) Watchdog Timer Failure
  e) CRC (cyclic redundancy check) failure
  f) RAM parity check failure
  g) Major electronic component Failures
  h) Tampering of circuitry, components and code Depending on specific applications and level of protection required, any of the faults the TPCI detects can be classified as an end-of-life condition within the microcontroller 188 code. An end-of-life condition can be used as a diagnostic tool to alert users to inspect the apparatus and connected electric wiring for dangerous conditions which may require repair or replacement of the apparatus, hence in this case, the TPCI is a re-usable apparatus by resetting its functions after momentarily disabling the power supply. An end-of-life condition can also be used as a self-destruct implement or cause irreversible damage to its circuit components and erase the software code loaded into the microcontroller 188 to render the TPCI permanently non-operational. This self-destruct feature is included within the TPCI's code routine.

By integrating the above circuits and components into a unitary device, the TPCI is able to perform the following functional elements of monitoring, circuit protection, and trip the circuit when any fault occurs, identify the faults as they occur and annunciate by visual and audible means:
  surge protection system;
  ground fault protection system;
  arc fault protection system;
  miswire detection system;
  glowing connection detection system;
  overload detection system;
  short circuit detection system;
  overvoltage and undervoltage detection system
  a system that operates in power systems with and without ground;
  a system to identify the fundamental frequency of the power supply and enable the device to adopt to it;
  system to annunciate system conditions and the occurrence of electrical faults
  system to automatically and periodically test the integrity of the circuit or self-test
  system to test the proper operation of the contacts when fault occurs
  system to determine end-of-life conditions;
  a tamper protection system;
  system to isolate the load from line side of the apparatus when a fault is detected and when test button is activated;
  system to reset or connect the load to the line side of the apparatus when the reset button is activated;
  system of identifying the type of fault that occurred in the circuit;
  a diagnostic system for false trip mitigation and identification of the same;
  an interface for charging external devices and implement software updates with wireless and wired connectivity.

Although the TPCI is integrated to perform all the functions disclosed in this invention, one skilled in the art recognizes that the different protection systems can be used individually, in groups or collectively as separate apparatus or system, or integrated with other systems, that are intended to detect specific faults and perform different functions.

The surge protection circuit elements 179/179A/179B is herein disclosed for exemplification purposes as a set of Metal Oxide Varistors (MOVs), commonly called varistors connected between the Line, Neutral, and Ground 171/172/173, which are appropriately rated to sustain surges on the TPCI from external sources, typically from lightning and any other external surge sources. When surge occurs, the high voltage clamps a varistor or varistors to become the path of least resistance sustaining the surge thereby protecting the load and TPCI circuits and components from the effects of the surge. Varistors are used herein for exemplification purposes, however, one skilled in the art recognizes that other components can be used to serve the same surge protection purposes as this invention. Although this method of surge protection is common for wiring devices, the surge protection circuit elements 179/179A/179B herein is included in this invention as a primary surge protection system of the TPCI. A secondary and a tertiary surge protection systems are provided with the TPCI utilizing the signals from the PTX 198 and MPCS 182 for digital analysis through specific algorithms within the microcontroller 188 code to detect, identify and annunciate the occurrence of surge faults, which are also explained in the following sections of this invention. The secondary and tertiary surge protection systems in this invention protects the TPCI circuit as well as the load connected to it, with a means to disconnect the load from the line, identify and annunciate the fault. The secondary and tertiary surge protection systems may be combined with the primary surge protection mentioned above to form a multi-system protection, or they may be implemented separately with the primary surge protection system.

The ground fault detection system element of the TPCI is in line with the GFCI disclosed in FIG. 3 and as discussed above. It comprises mainly of the test circuit 196/197, GFCS 180, the GFCI controller 181, an alternative ground fault signal conditioning circuit 187, while all other elements and components of the TPCI are used in common with the other detection systems. When a ground fault occurs between line 171/174 and ground 173/176, or neutral 172/175 and ground 173/176, a differential current is generated by the GFCS 180 which is processed by the GFCI controller 181 outputting a signal to the microcontroller 180 to signal the occurrence of a ground fault event. Alternatively, when a GFCI controller 181 is not used, the signal from the GFCS 180 is conditioned by the ground fault signal conditioning circuit 187 for the microcontroller 188 to execute its code routine for ground fault determination. When a ground fault condition is flagged, the trip circuit 189 is activated and trip solenoid 185A trips the contactor 190, thereby isolating the load connected to 174/175/176 from the line side 171/172/173. In addition to the TPCI test routine, the test circuit 196/197 is used as a means to test for mechanical integrity or the ability of the contactor to trip mechanically when fault occurs. As part of the TPCI test code routine, ground fault test is included with the multitude of tests used to verify that the TPCI is able to detect faults as it is intended to do when actual faults occur. The test circuit 196/197 is used as a means to simulate a ground fault by creating a differential current between line and neutral 171/172 that is generated by the ground fault current sensor 180, processed by the ground fault conditioning circuit 187 which then signals the microcontroller 188 through its code routine to trip the contactor 190 through the trip circuit 189, identify and annunciate the fault.

To satisfy a UL standard requirement for ground fault protection systems which is included as part of the TPCI, a ground fault periodic self-test routine separate from the TPCI's regular self-test routines is included in the TPCIs test program. To implement this periodic self-test routine, the TPCI utilizes its test circuit 196/197. This isolator switcher 197 can be an optocoupler, a relay, or similar switching devices that can be operated through the microcontroller 188. The periodic self-test routine is part of the microcontroller 188 code that controls the operation of the TPCI disclosed herein. When the periodic self-test routine is implemented, the test code routine using the test button 191 is momentarily suspended, the isolator switcher 197 is powered up by the microcontroller 188 and its isolated switch creates a ground fault event which will be detected by the microcontroller 188. Since at this instance, the test button routine is suspended, instead of tripping the contactor 190, a signal is implemented to indicate a successful periodic self-test and a working ground fault detection system, and the microcontroller 188 code resumes with its regular routines. If the periodic self-test fails, then it will be indicated as an end-of-life situation and the contactor 190 trips with annunciation. When the contactor 190 is either a double-solenoid or a retractable single-solenoid contactor where the tripping and resetting operation are controlled by separate solenoids, actual tripping and consequential resetting of the contactor can be done during the periodic self-test if it is desired to check the actual integrity of the contactor operation as well and not just the ground fault detection system.

When the test button 191 is pressed, the TPCI goes through a series of code routines to check for circuit integrity inputting data into the routine for the different faults it is intended to detect, not only ground fault, and as described in other embodiments herein disclosed, and subsequently trip the contactor 190.

The arc fault detection system element of the TPCI comprises mainly of the MPCS 182, anti-alias filter 186, buffer amplifier 186A, and MPCS 182 phase shift correction circuit 184 while these and all other elements and components of the TPCI are used in common with the other detection systems. When the TPCI line-side connections 171/172 are powered up, and the contactor 190 is on, the TPCI monitors the load through the load-side connections 174/175. The detection system is consistent with that disclosed in Tomimbang's patent application Ser. No. 13/528,809 on Jun. 20, 2012 and patent application Ser. No. 13/274,291 on Oct. 14, 2011. The MPCS 182 monitors the current flowing through the circuit connections 171/172/174/175 with a ratiometric output voltage which is proportional to the line current. The output signal from the MPCS 182 reflects the current flowing through the connections 171/172/174/175 with all the signal components necessary for monitoring the circuit and detection of arc and other faults herein disclosed. The MPCS 182 output signal goes through a phase shift correction and is synchronized to the line signal which creates the interrupt routine to start sampling. An anti-alias filter and buffer amplifier 186/186A are used to condition the current sensor signal to be suitable for signal processing by the microcontroller 188 in the detection of arc and other faults. When an arc fault occurs, the arc is determined through the microcontroller 188 which executes a code routine that differentiates a real arcing situation from an arc-mimicking signal, then activates the trip circuit 189 and eventually trip the solenoid-operated trip mechanism or contactor 190, thereby isolating the load from the line connections. Consequently with the determination of arc and tripping of the contactor, the microcontroller 188, through a specific routine in the microcontroller code, audible and/or visual indications are activated. A diagnostic feature is also included in the code routine that identifies every kind of fault that occur and are annunciated by audible and visual indications including a graphic display. When the test button is pressed, the TPCI goes through a series of code routines to check for circuit integrity for all the different faults it is intended to detect, not only arc fault, and as described in other embodiments herein disclosed.

The miswire detection element of the TPCI comprises mainly of the contactor position sensing circuit 193 which is exemplified in FIG. 10, while this and all other elements and components of the TPCI are used in common with the other detection systems. The miswire protection herein disclosed is multi-use, which remains operational even when the TPCI is disconnected and transferred from one circuit to another. This is unlike other commercial protective devices where their miswire protection is one-time use only where a component is permanently disabled thereby making said protective devices unable to detect miswire if they are taken out from an active circuit and re-installed elsewhere.

When the TPCI is wired improperly where the power source is connected to the load side 174/175/176 and the load connected to the line side 171/172/173, and the contactor 190 is off, the contactor position sensing circuit 193 provides signal to the microcontroller 188 that recognizes the presence of power on the load side of the contactor 190 although it is in off position indicating a miswire condition. The signal on the line side of the TPCI is also fed back to the microcontroller 188 through the phase shift correction circuit 184 which indicates the presence of power on the line side through a digital isolator such as an optocoupler separating the DC from AC circuitry. The line and load side sensing circuits provide the determination of miswire condition by feeding signal to the microcontroller 188 and to activate the tripping circuit 189 and trip the contactor 190 when a miswire condition exists. Consequently with the determination of miswire condition and tripping of the contactor, the microcontroller 188, through a specific routine in the microcontroller code, audible and/or visual indications are activated. A diagnostic feature is also included in the code routine that identifies the faults distinctly from another and are annunciated by audible and visual indications including a graphic display.

The glowing connection detection system of the TPCI is included in the arc detection system element. Glowing connection, although it starts as an arc, builds up energy over time until it develops into one. When an arc fault occurs, the arc is determined through the microcontroller 188 which executes a code routine that differentiates a real arcing situation from an arc-mimicking signal, then activates the trip circuit 248 and eventually trip the solenoid-operated trip mechanism or contactor 221, thereby isolating the load from the line connections. A diagnostic feature is also included in the code routine that identifies every kind of fault that occurred and are annunciated by audible and visual indications including a graphic display. The microcontroller 188 logs the number of repetitive arc events in a circuit and through a software-driven diagnostic feature of the TPCI, determines the possibility of a developing glowing connection condition and trips the circuit with a corresponding indication. Since glowing connection is a progressive event which starts with low level arcs, the repeated occurrence of similar arcs is determined, characterized, and after a defined number of repetitions within the microcontroller 188 code, it is identified as a potential glowing connection event. At that point, the microcontroller 188 trips the contactor 190, identify and annunciate the glowing connection event, and users need to check the TPCI for signs of developing glowing connection, tighten connections, reset the device, or replace it as necessary.

The TPCI is equipped with a secondary system to detect glowing connections using a temperature sensor circuit 200. Temperature sensors strategically positioned within the TPCI where glowing connections could likely occur provide the feedback to the microcontroller 188 for the occurrence of the fault. When any of the sensors is activated as a result of elevated temperatures beyond pre-determined normal conditions established as thresholds, a signal is fed back to the microcontroller 188, and a glowing connection condition is flagged by the microcontroller 188 code, activating the tripping circuit 189 with annunciation of the fault and an end-of-life condition. At this point, the TPCI needs to be physically inspected for possible glowing connection, and corrective actions done to correct loose connections or other technical issues causing the glowing connection, or replace it.

The overload detection system element of the TPCI is included as a part of the faults detected through the MPCS 182. The current flowing through the circuit connections through the MPCS 182 is converted into a ratiometric output voltage. The maximum operating current rating of the TPCI is scaled and made as a threshold within the microcontroller 188 code, and anything higher is considered an overload condition, with exception of momentarily high currents above the threshold which are normal starting characteristics of certain inductive loads, which are taken into consideration within the microcontroller 188 code. The output signal from the MPCS 182 reflects the current flowing through the connections 171/172/174/175 through the load with all the signal components necessary for monitoring and overload fault detection. When an overload fault occurs, the MPCS 182 signal go past the threshold set to be considered an overload over a pre-set dwell time to distinguish it from normal starting characteristics of certain electrical loads such as inductive motors.

The temperature sensor 200 for glowing connection detection system is also utilized as a secondary means to detect overload, and therefore becomes part of the TPCI overload detection system. Overload and glowing connections are distinguished by the level of temperatures determined through the data received from the temperature sensors fed back to the microcontroller 188. Overload signal from the temperature sensor circuit 200 can be an alarm only condition that only needs to be annunciated without tripping the contactor, but alternatively, it can be considered as a fault requiring the contactor 190 to trip through specific microcontroller 188 code routines.

When an overload occurs, the microcontroller, through its code routines then activate the trip circuit 189 and eventually trip the solenoid-operated trip mechanism or contactor 190, thereby isolating the load from the line connections. Consequently with the determination of overload and tripping of the contactor, the microcontroller 188, through a specific routine in the microcontroller code, audible and/or visual indications are activated. A diagnostic feature is also included in the code routine that identifies every kind of fault that occurred and are identified by frequency of audible and visual indications including a graphic display when desired.

The short circuit detection system element of the TPCI is included as a part of the faults detected through the MPCS 182. The current flowing through the circuit connections 171/172/174/175 through the MPCS 182 is converted into a ratiometric output voltage. The output signal from the MPCS 182 reflects the current flowing through the connections 171/172/174/175 with all the signal components necessary for monitoring and short circuit fault detection. Short circuit characteristics is defined by specific algorithms within the microcontroller 188 code. When a short circuit fault occurs, the microcontroller executes a code routine that activates the trip circuit 189 and eventually trip the solenoid-operated contactor 190, thereby isolating the load from the line connections. Consequently with the determination of short circuit fault and tripping of the contactor 190, the microcontroller 188, through a specific routine in the microcontroller code, audible and/or visual indications are activated. A diagnostic feature is also included in the code routine that identifies every kind of fault that occur and are identified by frequency of audible and visual indications including a graphic display when desired.

The overvoltage and undervoltage detection system element of the TPCI is a software-managed system wherein data received from PTX 198 is monitored and compared with normal operating parameters established within the TPCI code. The output of PTX 198 passes through a conditioning circuit 199 to make it suitable for processing by the microcontroller 182 for the determination of line voltage conditions according to the software code routine for overvoltage and undervoltage protection. The PTX 198 output is also used as an element for calculation of the load's power consumption which is also software-managed and is integral part of the TPCI routine. When the line voltage exceeds the TPCIs maximum voltage which is preset within the TPCI's code routine, or when the line voltage gets less than the TPCI's minimum rated voltage, both within a established threshold time, the code routine flags the condition as either an overvoltage or undervoltage condition, and sends a signal to the tripping circuit 189 to trip the contactor 190. A fault identifier in the code routine will provide the diagnostic display with annunciation indicating the fault that occurred.

The TPCI can operate with power sources that have ground and also those without system ground. This is made possible by having a resistive divider circuit 183 connected across the Line-Side Line and Neutral 171/172 which controls a circuit that creates an interrupt through a code-managed routine to synchronize the sampling of the current sensor data with the line signal. The microcontroller 188 interrupt process uses a built-in comparator and software-adjusted MPCS 182 zero reference offset voltage value equal to the stable output offset voltage value of the MPCS 182. The resistive divider circuit 183 allows acquisition of line signal for zero-cross reference for tripping the contactor 190 when fault occurs. The resistive divider 183 being connected across line 171 and neutral 172 rather than the line 171 and the system ground 173 enables the GFCI to operate even in systems without ground and regardless whether or not the line 171 and neutral 172 connections are reversed A digital isolator 184 such as and optocoupler isolates DC from AC circuitry.

The TPCI is provided with code-managed system to identify the fundamental frequency of the power source and operate based on the actual frequency. The TPCI is equipped with shared and specific code routines designed for different operating line frequencies. Once the TPCI is powered up, the unit starts sampling signals to identify the frequency. Once the line frequency is identified, the microcontroller code executes the TPCI code routines corresponding to that frequency.

The system to annunciate system conditions and the occurrence of electrical faults as an element of the TPCI is driven by the microcontroller 188 code. This is a feature integrated with the TPCI and which was disclosed in the Tomimbang Patent applications and patents relied upon in this invention. The TPCI is provided with visual indications to indicate system conditions and this is through LEDs to indicate power on, power off, fault conditions, end-of-life. As a diagnostic feature, every fault has a code-managed identifier and a designated indication by the frequency and time duration of on and off operations. Alternatively, the visual indication is through a graphic display with alpha and/or numerical characters to indicate the different system conditions, fault and end-of-life conditions. The system also is provided with audible indications using bells, buzzers and similar implements to annunciate fault and end-of-life conditions through a code-determined and designated indication by the frequency and time duration of on and off operations.

The system to test the integrity of the circuit or also called self-test feature element of the TPCI is a function driven by the microcontroller code and is performed repeatedly in a continuous loop. This insures that the system as a whole is properly operating at any given time when the TPCI is powered on, otherwise, it should indicate an end-of-life condition wherein the TPCI should be inspected for damage or taken out of service and replaced. This is a code-driven function which the microcontroller operates to insure the following:

a) that the microcontroller 188 clock counter has not reached a pre-determined lifetime limit set within the code
b) that the microcontroller ADC signal received from the MPCS 182 is normal indicating a good current sensor
c) that all microcontroller standard operating tests including CRC, RAM parity, and watchdog timer are operating normally
d) that the trip and reset circuit is operating properly
e) that there are no major electronic component failures
f) that the microcontroller can execute all its code routines
g) that the device is not tampered with The system for determination of end-of-life condition is implemented and managed within the microcontroller code, and is multi-purposed. When the TPCI is re-usable, it can be used as a diagnostic tool to alert users to inspect the apparatus and connected electrical wiring for dangerous conditions requiring repair or replacement. When the TPCI is not re-usable, the system for determination of end-of-life condition can be used as a self-destruct implement to cause irreversible damage to the apparatus' circuit and erase the microcontroller 188 code to render the apparatus permanently non-operational.

The tamper protection system of the TPCI is multi-system and includes mechanical, electronic and code-managed systems which can individually be implemented or combined for optimum protection. Mechanically, the TPCI housing is secured by tamper-proof fasteners to make it difficult to access its parts. Specific parts of the electronic circuitry is secured with ultra-thin conductors such that continuity in a part of the apparatus' circuit is severed by merely disassembling the apparatus. The microcontroller is manufactured with internal and external tamper protection. The microcontroller 188 through its code routines detect abnormal signals indicative of a tampered circuit as well as instrumentation signals indicative of a tampering operation. Upon detection of tampering operations, the microcontroller 188 executes its self-destruct function including its mass-erase routine where the TPCI becomes totally inoperable and the code becomes irrecoverable.

The system to test the proper operation of the contacts when fault occurs as an element of the TPCI is through the test button operation. This is to ensure that the tripping circuit 189 activates the trip solenoid 185A and the contactor 190 opens when the test button 191 is pressed. When the test button 191 is pressed, the microcontroller 188 executes routine to input a series of electrical faults defined by specific algorithms into the fault detection routine including arc, ground, overload, undervoltage, overvoltage, surge and glowing connections to insure that the detection system works and that the tripping mechanism is capable of tripping on a fault.

The system to isolate the load from line side of the apparatus when a fault is detected and when test button 191 is activated as an element of the TPCI is a function of the contactor 190 which is opened when the solenoid is activated by the trip circuit from a microcontroller 188 code routine executing its trip function when a fault is detected. The contactor 190 is also tripped when the test button is activated as explained above.

The system to reset or connect the load to the line side of the apparatus when the reset button is a manual type, utilizes a mechanical latch integrated within the contactor 190 which is activated by pressing the reset button. The mechanical latch of this reset button secures the contactor 190 contacts in an engaged position thereby connecting the Line 171/172 and load 174/175 sides of the TPCI. Once the reset button is engaged, the TPCI is engaged and operates to monitor and detect the occurrence of faults and other TPCI functions described in this invention. Alternatively, when the reset button is solenoid operated, pressing the reset button 192 causes the microcontroller 188 to execute a code routine to activate the reset circuit which is similar to the trip circuit except that in this case, there is a secondary solenoid 185B to execute the switching of the contactor 190, and thereby close the contactor 190 contacts to connect the line and load sides of the TPCI.

The means of identifying the type of fault that occurred in the circuit as an element of the TPCI is a diagnostic system which is part of the microcontroller 188 code routine. Every fault that occurs in the circuit protected by the TPCI is determined by specific characteristics defined by among others, frequency and time domain algorithms, with digital values that distinguishes them from normal circuit conditions and from other fault conditions. Each fault is therefore characterized within the code by digital values calculated by the different applicable algorithms, and outputs an identifier which the microcontroller 188 then converts into a pre-set annunciation method of audible and/or visual displays as discussed in other sections of this invention. With the identifier, users will have the ability to diagnose circuit conditions and the sources of electrical faults in the circuit and use it as a service tool.

The TPCI diagnostic system is used for false trip mitigation which has been a major concern for wiring device manufacturers. There are many electrical loads whose normal signals mimic the signature of an arc and as such causes the TPCI to trip even when it is not supposed to. By the diagnostic system, the TPCI, through its microcontroller code, is able to identify the specific fault that causes it to trip and determine if it is a real arc or a nuisance tripping condition which could be normal operating characteristics of certain electrical loads. With the fault identified, the data can be used to determine the characteristics of the electrical devices or loads causing false trips from which they could be distinguished from valid faults.

The interface for charging external devices as an element of the TPCI utilizes the power supply which is rated at a current level high enough to charge batteries of electronic devices. A USB charging port connected to the DC power supply is included as part of the TPCI.

The TPCI is provided with a wireable interface to connect to a control system to control the operation of the TPCI and therefore the loads connected to it, and obtain fault and diagnostic data. This is made possible by providing an input interface to the TPCI's microcontroller to control its operation remotely and transmit or receive switching or tripping command, and even provide diagnostic information. This feature applies to the case where the tripping and reset functions are done through separate solenoids. Alternatively, the TPCI is provided with wireless interface to receive and transmit data from a remote control center or device, to operate the TPCI and receive fault detection information as an output with audible and/or visual indications.

With the numerous functions the TPCI does, it operates on a rather complex code operating on a continuous loop monitoring system conditions and performing diagnostics. When the AFCI is first powered up and the reset mechanism is reset, the fault protected electrical circuit starts from the line side line conductor 171, goes through the current sensor 182 and contactor 190 to the load side line conductor 174, then through a connected load and back to the load side neutral conductor 175 and Line side neutral conductor 172. The electrical circuit ground conductor 173 is connected throughout the system, however, the TPCI can operate with or without the system ground 173. The DC power-driven components used by the TPCI are powered by a switch-mode power supply (SMPS) 177 that operates over a wide range of electrical power supply AC voltages and produces stable output DC voltages. MPCS 182 monitors the electrical circuit current flowing through the line conductor 171/174 from the line side to the load side where the current sensor 182 output voltages are proportional to the electrical circuit current load waveform with a stable output offset voltage. MPCS 182 provide the signal to the microcontroller 188 for the detection of arcs, surge, miswire, glowing connection, overload and short circuit faults. It also provides the power monitoring and metering information of the TPCI which is code-managed. When the microcontroller 188 detects any of these electrical circuit faults, a trip command is sent to the trip and reset switching circuit 189 that interrupts the fault protected electrical circuit by tripping the electromagnetic trip and reset mechanism 190. Visual 194 and audible 195 annunciation for the electrical circuit fault are then enabled. When the system reset switch 185A is subsequently enabled, the microcontroller 188 program initializes values and disables fault indicators, checks for system miswire and end-of-life conditions by evaluating the trip and reset sensing circuit 189. When system reset checks have successfully completed, the protected electrical circuit remain closed until another electrical circuit fault is detected by the microcontroller 188 code. The microcontroller 188 also through its code routines detects abnormal signals indicative of a tampered circuit as well as instrumentation signals indicative of a tampering operation. Upon detection of tampering operations, the microcontroller executes its self-destruct function including its mass-erase routine where the apparatus becomes totally inoperable and the code becomes irrecoverable.

GFCS 180 provides the signal to the MPCS 182 for the detection of ground faults.

PTX 198 monitors the voltage across the line side line and neutral conductors 171/172 and provides the signal to the microcontroller 182 for overvoltage, undervoltage, and surge faults. It also provides the power monitoring and metering information to the microcontroller 188.

TSC 200 provides the signal to the MPCS 182 for the detection of glowing connections, and also a secondary source of signal in the detection of overload.

The microcontroller 188 receiving input data from the MPCS 182, GFCS 180, PTX 198 and TSC 200, through its code operating continuously in a loop, executes all of the TPCI functions of detecting arcs, ground, surge, miswire, overload, short circuit, glowing connections, overvoltage, and undervoltage faults in DC, and AC, single and multi-phase systems; interrupt the circuit when any of said faults occur; provide diagnostics, identification and annunciation of faults that occur; and provide circuit monitoring and metering information. One skilled in the art recognizes that although exemplifications herein were for single-phase AC systems, the same principles of this invention applies to multi-phase and DC systems. Utilizing the data from the same sensors MPCS 182 and PTX 198, one skilled in the art also will recognize that phase loss protection in multi-phase systems can be provided by the TPCI with the detection of loss of voltage or current in any of the phases. With all the sensors integrated into the TPCI circuit, including the MPCS 182, GFCS 180, PTX 198 and TSC 200, contactor position sensing circuit 193 every kind of data necessary to detect and interrupt any electrical fault is available for the microcontroller to process, and therefore the TPCI affords total protection from electrical faults. While the TPCI performs a multitude of complex functions which would have been equivalent to a number of separate apparatus, systems and methods, the integration of systems and components with the operation being controlled by a single microcontroller makes the TPCI a noble invention. Furthermore, although this invention covers such a broad range of protection, it does not limit the usage of the systems herein disclosed to one device, rather, into multiple devices with specific single system or combination of the systems herein disclosed without departing from the principles of the current invention.

FIGS. 5, 5A, 6, 6A are exemplifications of the MPCS 182 in different forms and types. These exemplifications are not limiting but rather intended to teach one skilled in the art how the different sensors can be adopted for the purposes of the current invention.

The MPCS 182 come in different types, shapes, forms and methods of mounting in relation to the line conductor. The MPCS 182 output signal is conditioned to become suitable for processing by the microcontroller 188 for the detection of arcs and other faults, as well as for monitoring system conditions. One skilled in the art recognizes that the conditioning circuit may be integrated into the current sensor circuitry thereby having an output that can be directly used as a signal for processing by the microcontroller 188.

Figure 5:
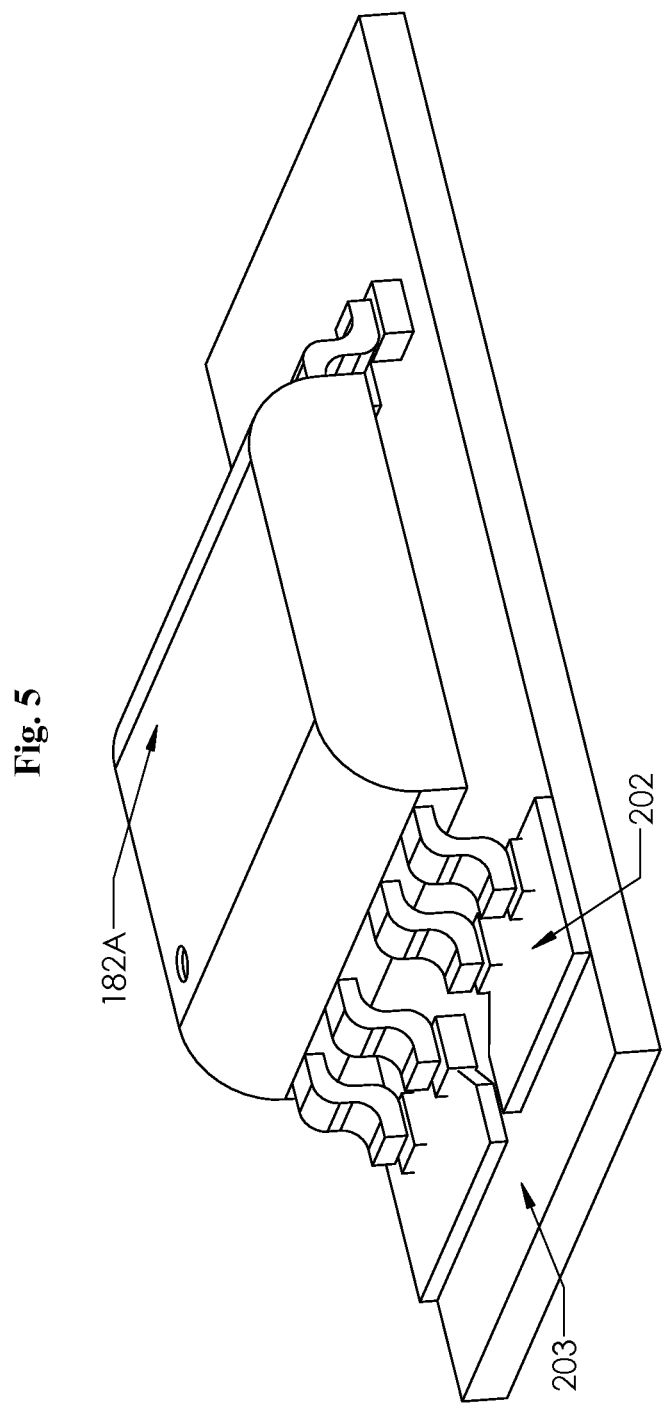
FIG. 5 is an illustration of the different types of current sensors used in the TPCI in accordance with the embodiments of the current invention.
Figure 5A:
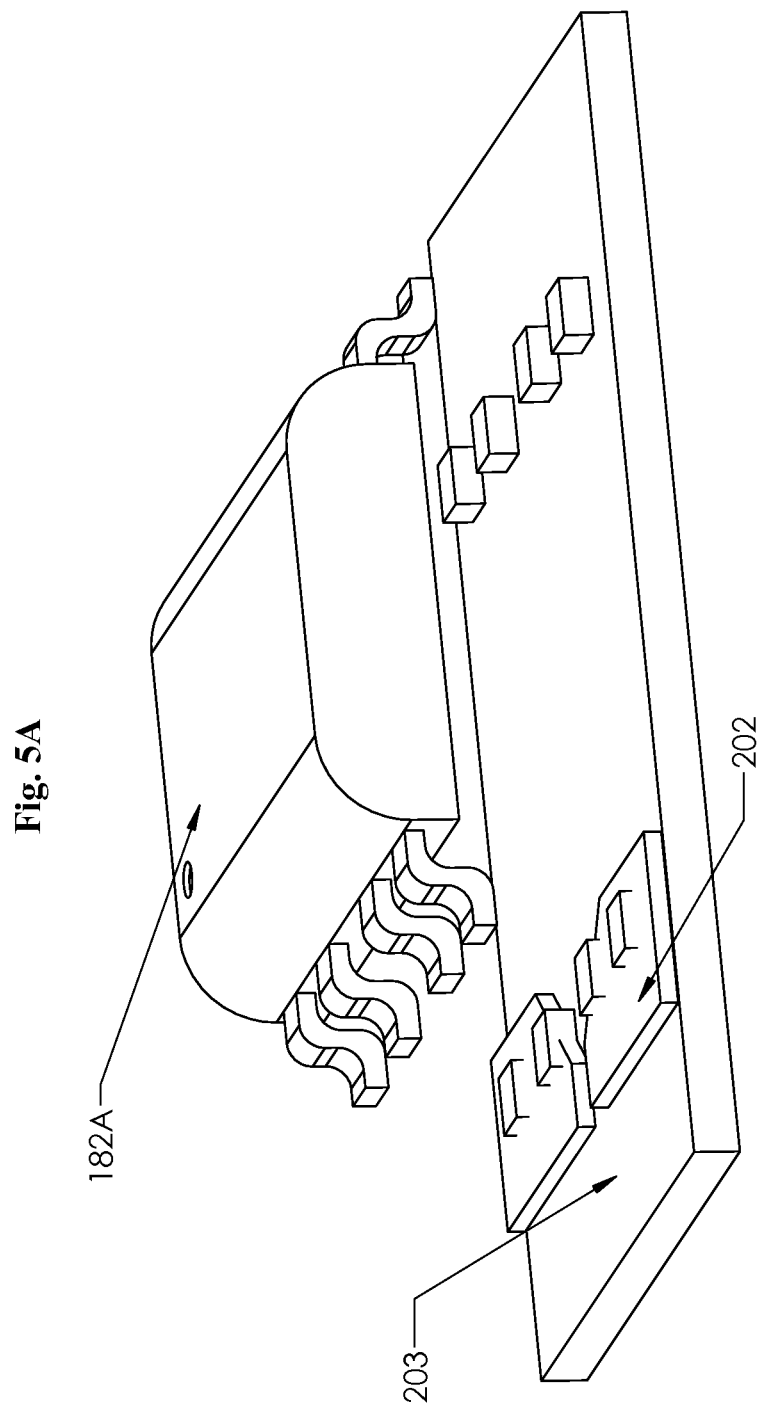
FIG. 5A is an illustration of the different types of current sensors used in the TPCI in accordance with the embodiments of the current invention.

FIGS. 5, 5A illustrate for exemplification purposes of this invention a type of MPCS 182 which is a Hall Effect Current Sensor Integrated Circuit of the contact type wherein the line 202 over a PCB 203 connects directly to its pins 204 and therefore line current passes through it. A ferromagnetic layer above the line connection of the current sensor develops a magnetic flux proportional to the line current which through its internal circuitry, is converted into a ratiometric voltage output. This Hall Effect Current Sensor 182A is in principle similar to ALLEGRO MICRO family of Hall Effect Current Sensor integrated circuits in different forms, shapes and mounting methods in relation to the conductor being monitored. This current sensor 182A is power-driven, and the output signal is typically in volts that is ratiometric to the line current. Although also used for current sensing in other applications these type of magnetic hall effect current sensor integrated circuit current sensors have not been used in Electrical Fault detection systems and apparatus as disclosed in Tomimbang's current invention.

Figure 6A:
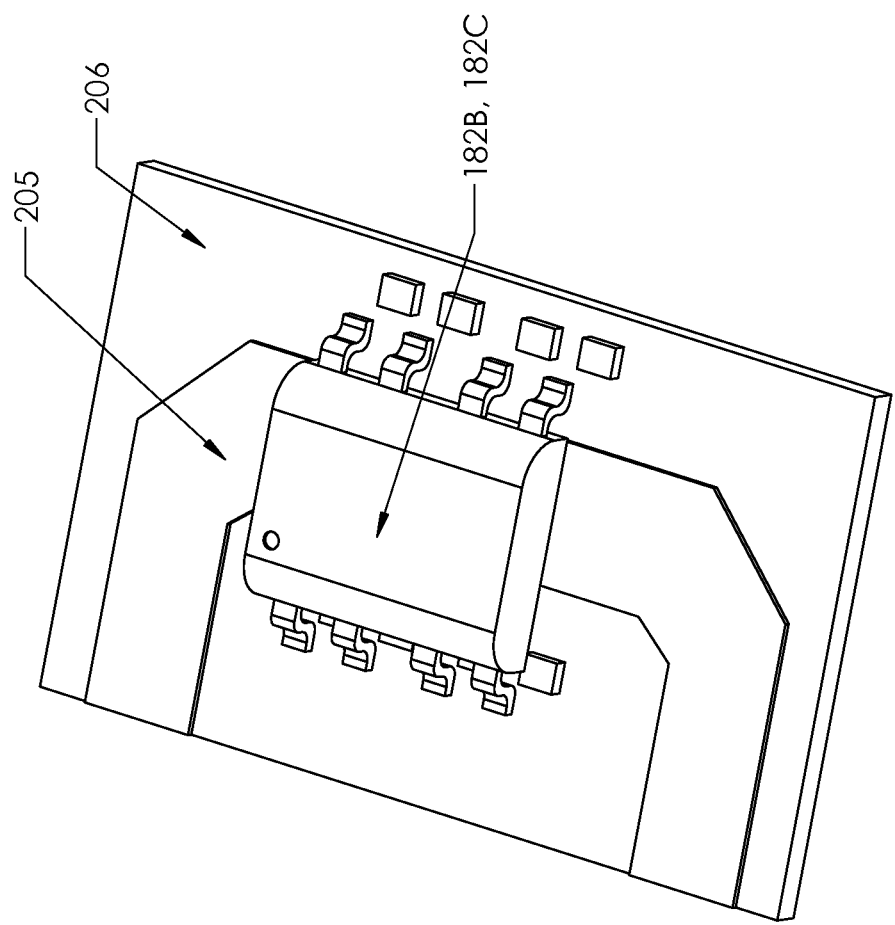
FIG. 6A is an illustration of the different types of current sensors used in the TPCI in accordance with the embodiments of the current invention.

FIGS. 6, 6A illustrate for exemplification purposes of this invention an alternative type and variant of MPCS 182 which is a non-contact or contact-less current sensor integrated circuit wherein the line current does not pass through any part of the device. This type of a current sensor is a CMOS (Complementary Metal Oxide Semiconductor) Hall Effect Current Sensor integrated circuit 182B with a ferromagnetic layer structured on its surface used as a magnetic flux concentrator providing a high magnetic gain which significantly increases the signal to noise ratio of the sensor. This current sensor 182B is particularly appropriate for DC and AC current measurements, with ohmic isolation, very low insertion loss, fast response time, small package size and low assembly cost requirements, which is ideal for the purposes of Arc fault detection and interruption as covered by the current invention. This current sensor 182B is power-driven, and the output signal is typically in volts that is ratiometric to the line current. This current sensor 182B is in principle similar to those of MELEXIS family of Hall Effect Current Sensor integrated circuits in different forms, shapes and mounting methods in relation to the conductor being monitored. The conductors used in this current sensor for AFCI applications can be traces 205 in a PCB 206, conductive strips, or wires routed under the sensor, above or on the side of the conductor depending on the form or shape of the current sensor used. Although also used for current sensing in other applications, these non-contact type magnetic hall effect current sensor integrated circuits have never been used in Electrical Fault detection systems and apparatus as disclosed in Tomimbang's current invention.

FIGS. 6, 6A likewise exemplifies a Giant MagnetoResistance (GMR) Current Sensor 182C which is also a non-contact or contact-less current sensor integrated circuit that senses the current by converting the magnetic field generated by currents flowing through the line conductor into a voltage, which is proportional to the field. GMR sensors produce a large change in resistance when they are subjected to a magnetic field. Multi-layer GMR sensors adopt a wheatstone bridge resistance structure for stable performance at varying temperatures of application. Provided with a magnetic concentrator, this current sensor 182C generates a signal that is sensitive to the magnetic field corresponding to the current passing through the line conductor. Operating on low voltage, high sensitivity, ohmic isolation, very low insertion loss, fast response time, small package size and low assembly cost requirements it is appropriate for DC and/or AC current measurements, which is ideal for the purposes of Arc fault detection and interruption as covered by the current invention. These sensors exemplified are in principle similar to NVE Corporation's GMR current sensors such as their AA & AB series of current sensors and their variants in different forms, shape and mounting in relation to the conductor being sensed for current flow. The conductors used in this current sensor 182C for AFCI applications can be lands or traces 205 in a PCB 206, strips or wires routed under the sensor, above or on the side of the conductor depending on the form or shape of the current sensor. Although also used for current sensing applications, GMR sensors in particular have never been used in Electrical Fault detection systems and apparatus as disclosed in Tomimbang's current invention.

The non-contact current sensors 182 B/182C illustrated in FIGS. 6, 6A can have the conductors configured in any manner or form such as PCB traces, a wire, or shaped metallic material. For higher currents, these sensors may be positioned in busbars as well.

An alternative current sensor MCPS 182 is also disclosed herein as a traditional isolated type current transformer or transducer with a linear current output. This current transformer is a non-contact or contact-less current transformer sensor wherein the line current does not pass through any part of the device. Instead, the conductor passes through the core with air as medium of isolation between the line and the windings of the transformer. A resistive component is connected to the winding of the current transformer to derive a voltage that is ratiometric to the line current. Although this type of linear current transformer is also used for current sensing in other applications, it is not typically used in Electrical Fault detection systems and apparatus in the same manner disclosed in the current invention.

One skilled in the art recognizes that using the principles of this invention, the TPCI is not limited to the type of sensors MPCS 182 that can be used to attain the same objectives laid down herein.

FIGS. 7, 7A, 7B, are illustrations on the application of temperature sensors with a receptacle outlet TPCI according to the embodiments of the current invention. Temperature sensors 210/211/212/213 come in different forms, shapes and mounting styles, and these illustrations are exemplifications to teach one skilled in the art of the different applications of temperature sensors to apparatuses such as the TPCI, or any other apparatuses with a magnetic contactor and a tripping control circuit. In these illustrations, the temperature sensors 210/211/212/213 are PCB 214 mounted with physical contact with the mounting studs 209 of screws 208 that are used to secure wiring with the receptacle outlet 207. The sensors 210/211/212/213 are mounted within sensing proximity to the monitored parts of the TPCI where glowing connections could likely occur. Before glowing connection occurs, the build-up of temperature activates any of the temperature sensors at pre-determined level past normal operating temperatures and below actual glowing connection conditions. FIGS. 7, 7A, 7B are sections within a receptacle outlet 207 that illustrates the temperature sensors 210/211/212/213 mounted on the PCB 214 as an exemplification of the different ways they can be mounted on a TPCI. Here the temperature sensors 210/211/212/213 are mounted on the surface of the PCB 214 and in physical contact with the terminal mounting stud 209.

Figure 9:
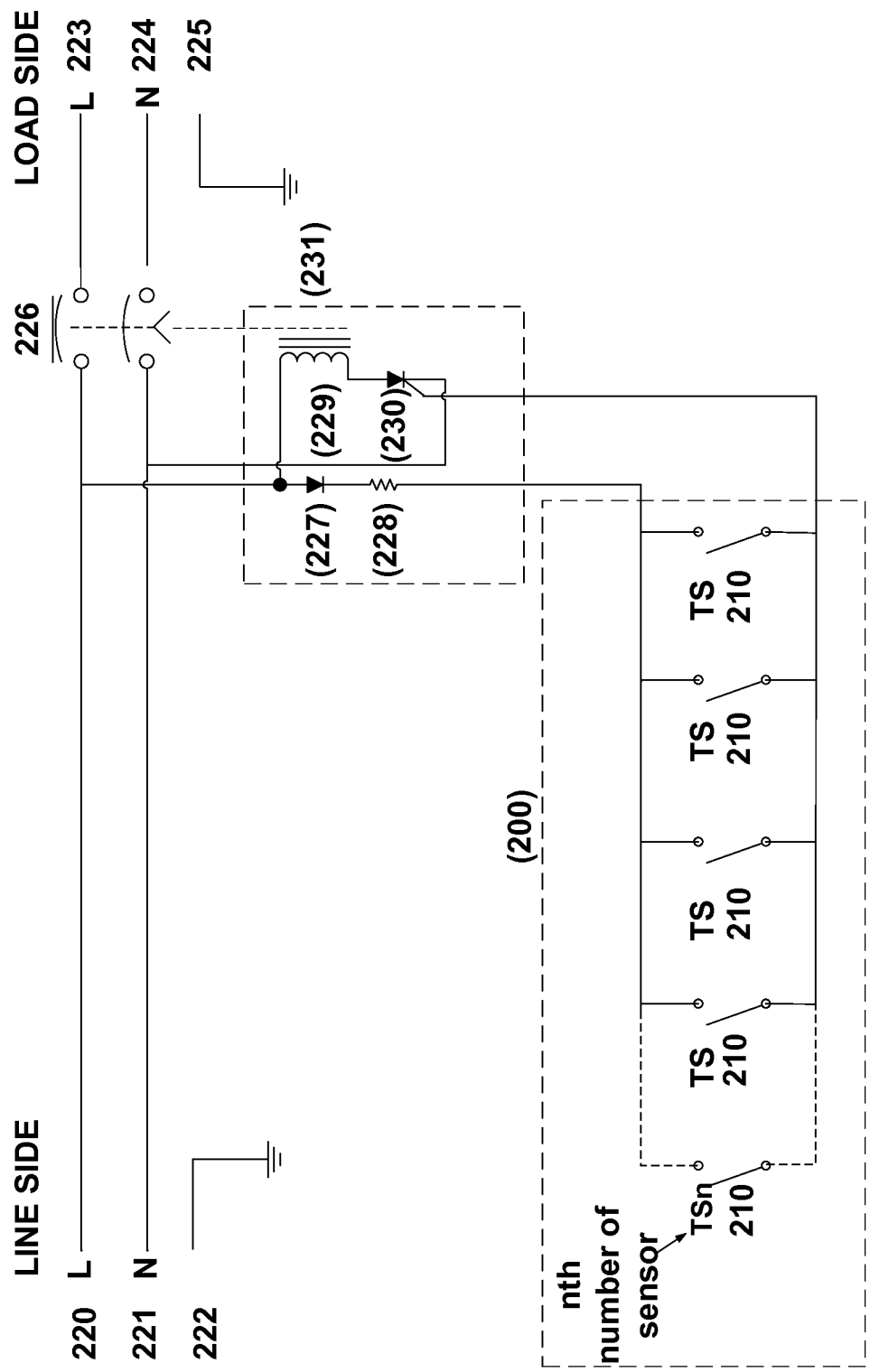
FIG. 9 illustrates the temperature sensor circuit exemplified in FIG. 8 configured to a wiring device provided with a solenoid-activated tripping mechanism or contactor such as receptacles, convenience outlets, multi outlet power strips, GFCIs, and AFCIs, for glowing connection and overload protection in accordance with the embodiments of the current invention.

For further exemplification on the applications of the current invention with the use of temperature sensors 210/211/212/213 for overload and glowing connection protection, FIG. 7C shows a multi-outlet power strip 249 provided with a solenoid-activated tripping mechanism or contactor as schematically illustrated in FIG. 9. FIGS. 7D and 7E are partial views inside the multi-outlet power strip housing 248 showing the temperature sensors 210/211/212/213 strategically positioned on the Line 245 and Neutral 246 stampings that make contact with the blades of the plugs when inserted. These stampings 245 and 246 are considered where glowing connection could likely occur since they are the connection points to the plugs' neutral and line blades. The Line/Neutral 242/244 connections to power line are connected to the line and neutral stampings 245/246 through a magnetic contactor with a solenoid-operated tripping mechanism and tripping control circuit within the multi-strip power strip 249, which are not shown. The ground stamping and connection 247/243 are shown as being part of the multi-outlet power strip 249 connections to the power supply system ground. When any of the sensors 210/211/212/213 is activated as a result of overload or glowing connection build-up, the control circuit is activated thereby tripping the contactor that isolates the line and load connections to the multi-outlet power strip 249. Anyone skilled in the art recognizes that by applying the principles laid down in the current invention, these temperatures sensors 210/211/212/213 can be configured into a control circuit to either directly trip a tripping mechanism through a control circuit or provide input to a microcontroller that controls the tripping circuit as part of a TPCI or similar apparatus. One skilled in the art also recognizes that using the same principles of the current invention, the temperature sensors can also be remote temperature sensors, infrared sensors, and the like, feeding back data on the monitored points within the TPCI to the microcontroller for glowing connection and overload protection system.

FIGS. 8, 8A, 8B, 8C, 8D are exemplifications of temperature sensor circuit 200 and the different ways it can be applied for TPCI glowing connection and overload protection as explained in the different embodiments of the current invention. For exemplification purposes, the TPCI illustrated in FIGS. 7, 7A, 7B are used herein. These temperature sensor circuit configurations are only examples and are not limiting as temperature sensors come in different types, forms, shapes and mounting styles and can be configured in suitable manner to satisfy the principles of the current invention. These exemplifications are not limiting but to teach one skilled in the art of different ways to configure and apply the temperature sensor circuit with the TPCI and similar apparatuses for glowing connection and overload protection.

Figure 8:
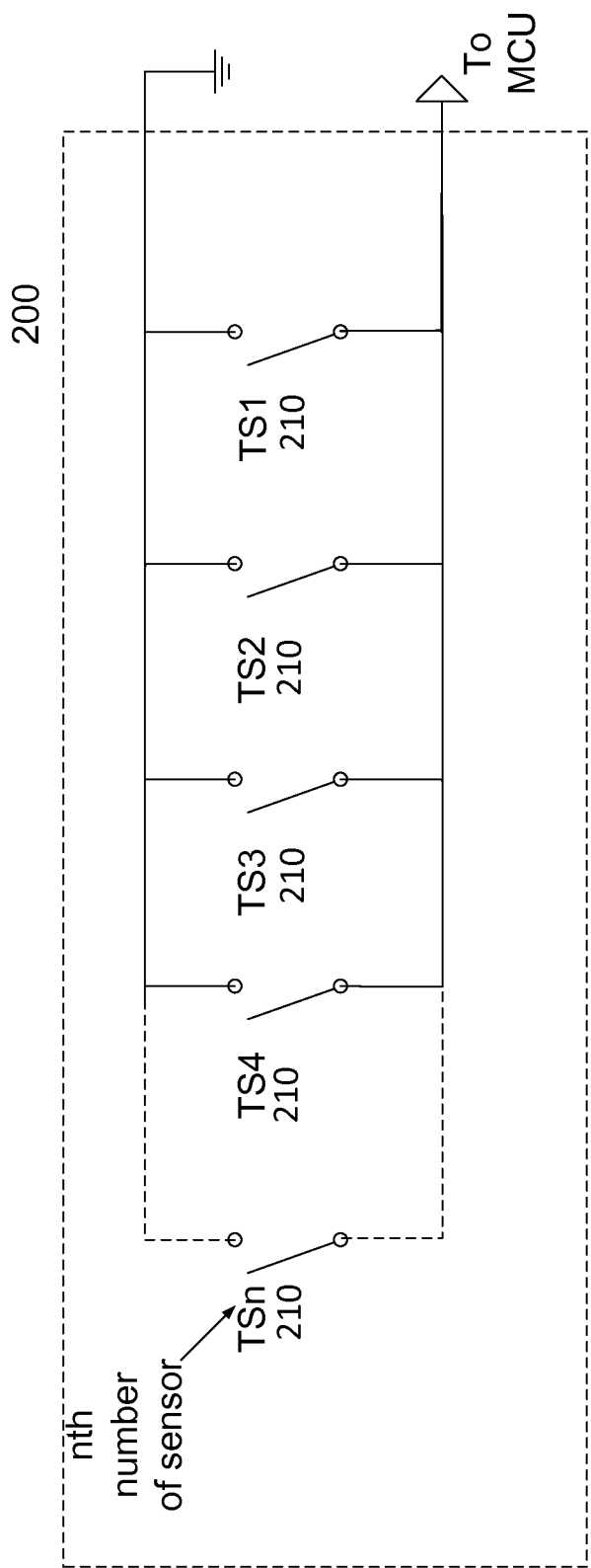
FIG. 8 is a sample circuitry exemplifying ways temperature sensors can be configured for glowing connection and overload protection in accordance with the embodiments of the current invention.

FIG. 8 illustrates a temperature sensor circuit 200 with sensors 210 as temperature activated switches strategically located in the TPCI where glowing connection could likely occur such as with the mounting stud 209 of a receptacle outlet where wires are secured to by a screw 208 or similar fastening means. They can be strategically located as well at the stampings which connects with plug blades or pins. They are connected in parallel with each other and with any additional number of sensors TSn as necessary to provide optimum protection. Any sensor 210 in the temperature sensor circuit 200 getting activated as a result of elevated temperature before actual glowing connection occurs, closes a circuit that provides an input to the microcontroller 188 for glowing connection detection. Alternatively, the temperature sensors 210 can be bi-metallic switches that activates at rated temperatures. These bi-metallic switches will serve the same purposes as the temperature activated switches 210. The TPCI glowing connection protection circuitry is intended as a pre-emptive method to arrest the occurrence of glowing connection during its build-up stage and when it actually happens. The sensors 210 have a specified switching temperature rating which is that level in which a glowing connection building up can be safely arrested and which is higher than the normal TPCI operating temperature. The temperature sensor circuit exemplified in FIG. 8 can also be used for overload protection of the TPCI since overload is also determined by elevated temperatures as glowing connection.

Figure 8A:
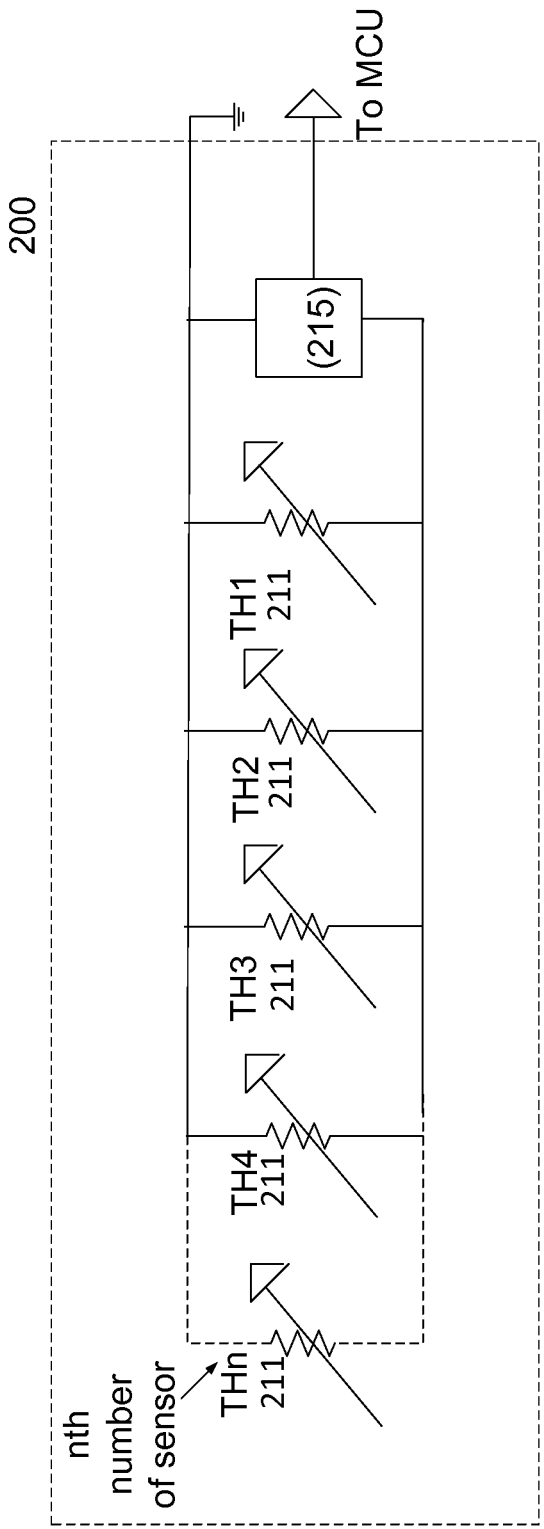
FIG. 8A is another sample circuitry exemplifying ways temperature sensors can be configured for glowing connection and overload protection in accordance with the embodiments of the current invention.

FIG. 8A illustrates a temperature sensor circuit 200 with temperature sensors 211 being thermistors or elements which varies their resistance with temperature that are strategically located in the TPCI where glowing connection could likely occur such as with the mounting stud 209 of a receptacle outlet where wires are secured to by a screw 208 or similar fastening means. They can be strategically located as well at the stampings which connects with plug blades or pins. They are connected in parallel with each other and with any additional number of sensors THn as necessary to provide optimum protection. Any temperature sensor 211 in the temperature sensor circuit 200 with a resistance change deviating from established normal condition values as a result of elevated temperatures before glowing connection or overload occurs, provides an output that is transformed into a signal input to the microcontroller 188 by the data converter 215 for glowing connection and overload detection. In normal condition, the temperature sensor circuit 200 has a pre-determined resistance range which is monitored through the data converter 215 that outputs a signal to the microcontroller 188 which is evaluated through its code routines to determine the occurrence of high temperatures that preludes a glowing connection and overload conditions. Overload and glowing connections are distinguished by the level of heat determined through the data received by the microcontroller 188 from the sensors 211. Overload condition also is determined as a generally stable condition and therefore a generally stable temperature despite elevated temperatures whereas a glowing connection is characterized by an increasing temperature especially in its build-up stage. Overload signal from the temperature sensor circuit 200 can be an alarm only condition that does not require tripping of the contactor, but alternatively, it can be considered as a fault requiring the contactor 190 to trip. The TPCI glowing connection protection system is intended as a pre-emptive method to arrest the occurrence of glowing connection during its build-up stage and when it actually happens. Overload and glowing connection conditions can be distinguished from each other through the level of temperature on the monitored points of the TPCI, and these temperatures are established as thresholds within the microcontroller 188 code for detection of these fault conditions.

Figure 8B:
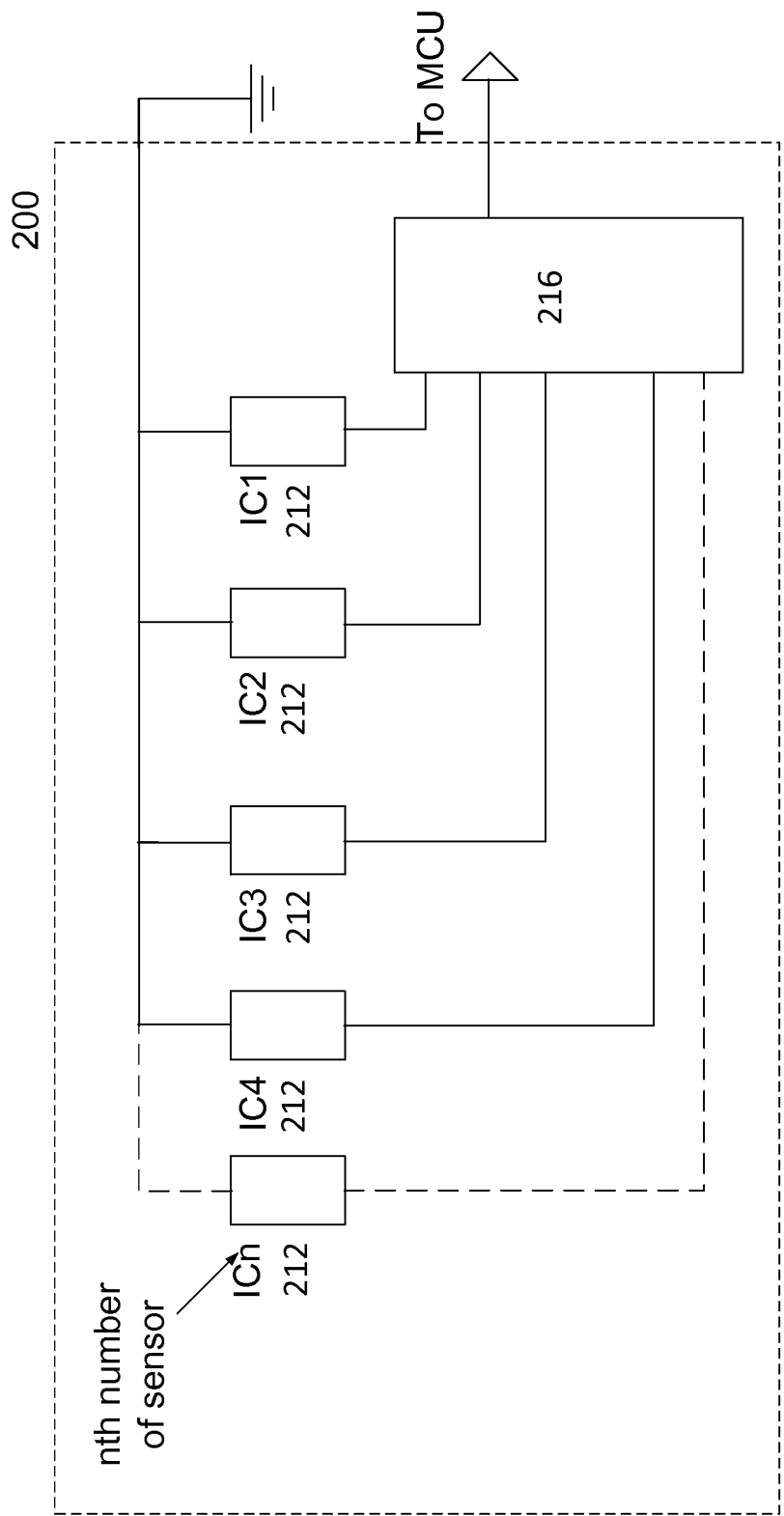
FIG. 8B is another sample circuitry exemplifying ways temperature sensors can be configured for glowing connection and overload protection in accordance with the embodiments of the current invention.

FIG. 8B illustrates a temperature sensor circuit 200 utilizing temperature sensor Integrated circuits 212 which senses temperatures on the monitored points of the TPCI and outputs signals to the microcontroller 188 through the data converter 216 for detection of glowing connection and overload. These temperature sensor ICs 212 are strategically located in the TPCI where glowing connection could likely occur such as with the mounting stud where wires are installed to by a screw or similar fastening means. They can be strategically located as well at the stampings which connects with plug blades or pins. They are connected in parallel and could have any additional number of sensors ICn as necessary to provide optimum protection to cover all locations in the TPCI where glowing connection could likely occur. The sensors 212 in the temperature sensor circuit 200 are monitored through a data converter circuit 216 that outputs signals to the microcontroller 188 which are evaluated through its code routines by comparing values with pre-determined normal condition values established within the microcontroller code to determine the presence of elevated temperatures that preludes glowing connection and overload conditions. When said conditions are detected, the microcontroller 188 executes its code routines to trip the contactor 190. Overload and glowing connections are distinguished by the level of temperature determined through the data received from the sensors and fed back to the microcontroller 188. Overload condition also is determined as a generally stable condition and therefore a generally stable temperature whereas a glowing connection is a varying condition specially in its build-up stage where temperatures build up over time. Overload signal from the temperature sensor circuit 200 can be an alarm only condition that does not require tripping of the contactor, but alternatively, it can be considered as a fault requiring the contactor 190 to trip. The TPCI glowing connection protection system is intended as a pre-emptive method to arrest the occurrence of glowing connection during its build-up stage and when it happens.

FIG. 8C illustrates a temperature sensor circuit 200 consisting of resistance temperature detectors (RTD) 213 which senses temperature values from pre-set specifications and outputs a signal to the microcontroller for glowing connection and overload detection. These temperature sensor RTDs 213 are strategically located in the TPCI where glowing connection could likely occur such as with the mounting studs where wires are installed to by a screw or similar fastening means. They can be strategically located as well at the stampings which connects with plug blades or pins. They are connected in parallel and with any additional number of sensors RTDn as necessary to provide optimum protection and cover all locations in the TPCI where glowing connection could occur. The sensors 213 in the temperature sensor circuit 200 are monitored through a data converter 217 that outputs a signal to the microcontroller 188 which is evaluated through its code routines to determine the occurrence of high temperatures that prelude a glowing connection and overload conditions by comparing the data with established values within the microcontroller 188 code for normal operating conditions. When glowing connection is detected from elevated temperatures detected by any of the sensors 213, the microcontroller 188 executes its code routines to trip the contactor. Overload and glowing connections are distinguished by the level of heat determined through the data received from the sensors 213 and fed back to the microcontroller 188 through the data converter 217. Overload condition also is determined as a generally stable condition and therefore a generally stable temperature whereas a glowing connection is a varying condition characterized by increasing temperatures specially in its build-up stage. Overload signal from the temperature sensor circuit 200 can be an alarm only condition that does not require tripping of the contactor, but alternatively, it can be considered as a fault requiring the contactor 190 to trip. The TPCI glowing connection circuitry is intended as a pre-emptive method to arrest the occurrence of glowing connection during its build-up stage and when it actually happens.

Figure 8D:
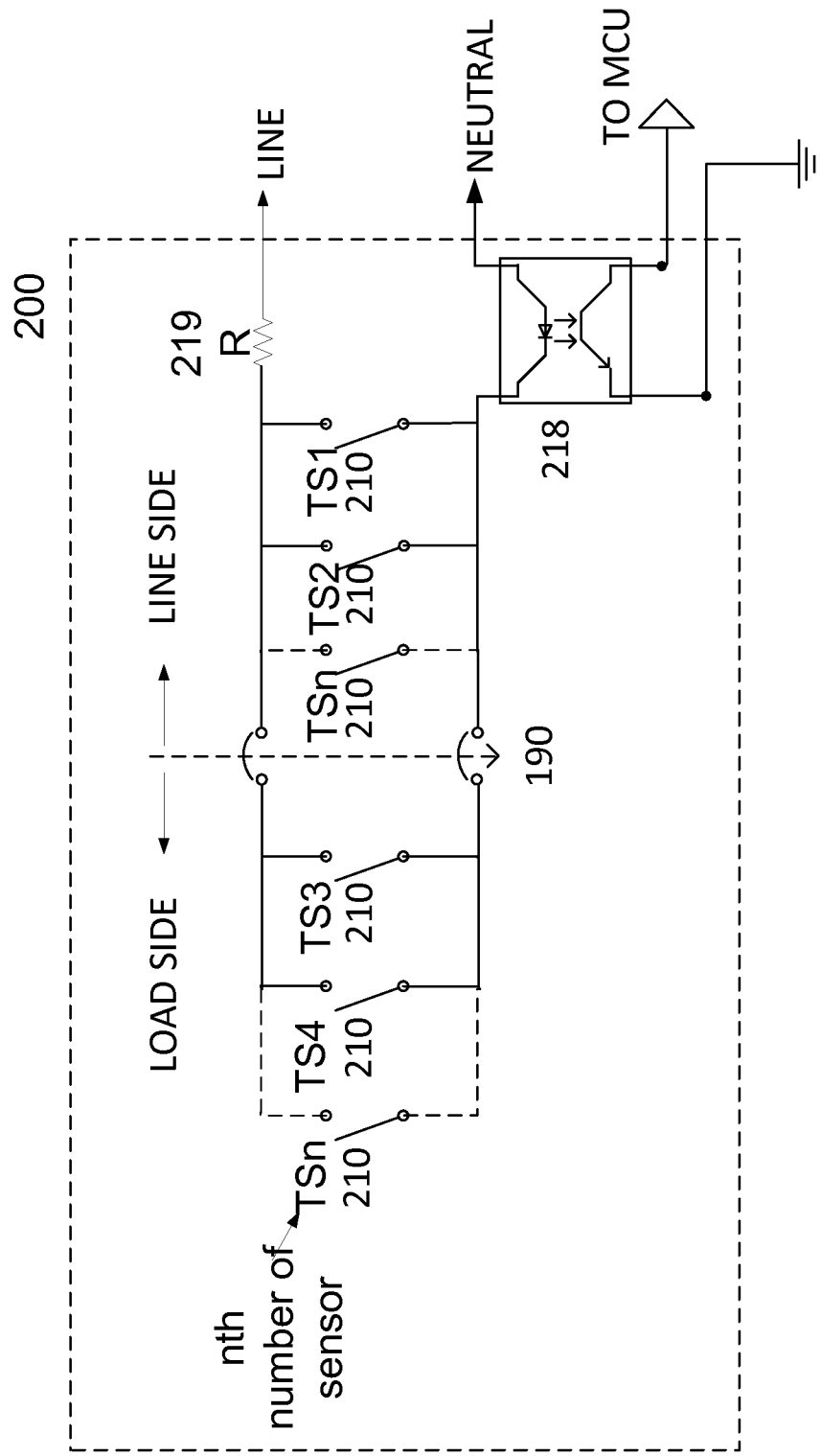
FIG. 8D is another sample circuitry exemplifying ways temperature sensors can be configured for glowing connection and overload protection in accordance with the embodiments of the current invention.

FIG. 8D illustrates a temperature sensor circuit 200 with sensors 210 as temperature activated switches strategically located in the TPCI where glowing connection could likely occur such as with the mounting stud where wires are installed to by a screw or similar fastening means. They can be strategically located as well at the stampings which connects with plug blades or pins. Unlike the other circuits illustrated in FIGS. 8, 8A, 8B, & 8C which typically applies to low voltage electronic circuits, FIG. 8D illustrates the temperature sensors directly connected to the power system Line and Neutral through a resistive element 219 with a digital isolator 218 such as an optocoupler to give a low voltage electronic signal to the microcontroller 188 for the detection of overload and glowing connection. In this exemplification circuit, the sensors 210 on the load side are separated by the contactor 190 from the line side. Any sensor 210 in the temperature sensor circuit 200 getting activated as a result of elevated temperature before glowing connection occurs, closes the circuit to provide an input to signal the microcontroller for a glowing connection event. This exemplification circuit can be used to directly trigger a tripping mechanism operating on the line voltage such as common GFCIs in the market, and which does not necessarily require a microcontroller controlling its operation, but rather directly switching a tripping circuit in said device, as exemplified in FIG. 9. This exemplification circuit can be used as well for convenience outlets with a tripping mechanism provided with a solenoid to isolate the load and line sides of the device. The sensors 210 have a specified switching temperature rating which is that level in which a glowing connection building up can be safely arrested and which is higher than normal TPCI operating temperatures.

One skilled in the art recognizes that using the principles of this invention and these temperature sensor circuits as exemplifications, any apparatus, or system provided with a tripping circuit can be protected from glowing connection and overload conditions. The TPCI glowing connection protection circuitry is intended as a pre-emptive system to arrest the occurrence of overload, and glowing connection during its build-up stage and when it actually happens.

FIG. 9 illustrates the temperature sensor circuit exemplified in FIG. 8 applied to a circuit of an apparatus provided with a solenoid-activated tripping mechanism or contactor 226 such as convenience outlets, multi outlet power strips, GFCIs, and AFCIs. This tripping circuit 231 utilizes a solenoid 229 which is integral part of the contactor 226, a thyristor for switching, a switching diode 227 and a resistive element 228. The tripping circuit 231 is activated by any of the sensors 210 getting switched on due to elevated temperatures when glowing connection starts to develop. The sensors 210 have a specified switching temperature rating which is that level in which a glowing connection building up can be safely arrested and which is higher than normal TPCI operating temperatures. The TPCI glowing connection circuitry is intended as a pre-emptive method to arrest the occurrence of glowing connection during its build-up stage and when it actually happens.

FIG. 10 illustrates the contactor position sensing circuit used in the TPCI for miswire detection as explained in the different embodiments of the current invention. A digital isolator such as an optocoupler 240 is connected across the Load-side Line and Neutral connections 234/235 of the TPCI through a resistive divider 238/239. When the load side of the TPCI is powered up, it means that the contactor 237 is on reset position, unless the TPCI is miswired as a load-line reverse condition. This circuit is used for miswire detection as well as for testing the integrity of the TPCI to trip on the occurrence of fault or when the test button is pressed, and to reset when the reset button is pressed.

What is claimed is:

1. An apparatus for detection and interruption of electrical circuit arc, surge, miswire, overload, short circuit, glowing connection, undervoltage, overvoltage, and ground faults, and for monitoring of circuit conditions with microcontroller controlled integrated circuits and systems to detect the occurrence of said electrical faults, said apparatus comprising:
    an integrated circuit having a system in it to monitor and detect series and parallel arcs,
    an integrated circuit having a system in it to monitor and detect ground and leakage current faults,
    an integrated circuit having a system in it to monitor and detect surge,
    an integrated circuit having a system in it to monitor and detect miswire,
    an integrated circuit having a system in it to monitor and detect overload,
    an integrated circuit having a system in it to monitor and detect short circuit,
    an integrated circuit having a system in it to monitor and detect glowing connections, said glowing connection monitor and detect system being a fault preventative system having a temperature sensor circuit being configured within said integrated circuit to pre-emptively detect anomalous circuit connections temperatures,
    an integrated circuit having a system in it to monitor and detect overvoltage and undervoltage, all of said integrated circuits' systems operating on direct current systems, single phase alternating current systems, or multi-phase alternating current systems, and being simultaneously monitored and managed by a microcontroller, said microcontroller being programmed with algorithm based software code,
    and upon said software code driven microcontroller detecting a fault condition in any of said integrated circuit fault detection systems,
    said microcontroller identifies said fault, interrupts the circuit, and annunciates the fault that occurred, and sends output data for system conditions and power calculations.

2. The apparatus of claim 1 wherein the integrated circuits and systems can be used individually and collectively in groups to detect and interrupt only specific faults and output only specific data for annunciation of system conditions.

3. The apparatus of claim 1 wherein the signals from a multi-purpose current sensor, ground fault current sensor, said temperature sensor circuit, contactor position sensing circuit, and potential transformer provides the data necessary for the microcontroller to process, detect and interrupt all of said electrical faults.

4. The apparatus of claim 1 wherein the surge protection system is a multi-system, said multi-system having a primary, secondary and tertiary system, said primary protection system being surge protection elements sustaining the surge on the occurrence of surge fault by becoming the path of least resistance within the protected circuit without isolating a load from the line side, said secondary protection system being the detection of surge faults through digital analysis of a multi-purpose current sensor output signals utilizing the apparatus' surge fault detection algorithms within its microcontroller code, and said tertiary protection system being the detection of surge faults through digital analysis of the potential transformer signals utilizing said apparatus' surge fault detection algorithms within its microcontroller code, secondary and tertiary protection systems providing the means for the load to be isolated from the line side by tripping the contactor, identifying and annunciating a fault, said secondary and tertiary protection systems being capable of being used separately or combined in conjunction with the primary surge protection system, said surge fault protection circuit being an integrated part of the apparatus' overall integrated and monitoring systems.

5. The apparatus of claim 1 wherein the Ground Fault integrated circuit detects ground faults through analysis of a ground fault signal received from a ground fault current sensor by executing ground fault detection algorithms as part of the apparatus' microcontroller code thereby providing additional means to mitigate the occurrence of false trips prevalent with commercial GFCIs, said ground fault integrated circuit being integral part of the apparatus' fault protection and monitoring system.

6. The apparatus of claim 1 wherein the arc fault integrated circuit detects the occurrence of arc faults through analysis of a multi-purpose current sensor signals by executing arc fault detection algorithms as part of the said apparatus' microcontroller code, evaluating said signals through a series of routines within the same microcontroller code to determine real arcs from normal operating characterisistcs of certain electrical loads that mimics that of an arc thereby avoiding the occurrence of false trips, said arc fault protection circuit being integral part of the apparatus' fault integrated and monitoring system.

7. The apparatus of claim 1 wherein the miswire integrated circuit is a multi-use miswire protection wherein said multi-use miswire protection utilizes a contactor position sensing circuit which feeds signal to the microcontroller to indicate whether the contactor is in off or reset position, said miswire circuit being managed through said apparatus' microcontroller code continuously tripping the contactor when being reset until the miswire condition is corrected, and said miswire integrated circuit being integral part of the apparatus' fault protection and monitoring system.

8. The apparatus of claim 1 wherein the glowing connection integrated circuit is pre-emptive and multi-system which can be implemented individually or combined for optimum protection, said multi-system having primary and secondary circuits, said primary circuit being through the microcontroller's logging, analysis, and identification of the occurrence of repeatable faults over a specified span of time utilizing the said apparatus' system of identifying faults, and said secondary circuit being through the use of a temperature sensor circuit utilizing temperature sensors strategically located within the apparatus where glowing connections could likely occur to trip a contactor when temperatures are elevated beyond normal operating temperatures, said glowing connection integrated circuit being utilized as a secondary system to detect overload conditions, said glowing connection circuit being integral part of the apparatus' fault protection and monitoring system.

9. The apparatus of claim 1 wherein the overload integrated circuit is multi-system which can be implemented individually or combined for optimum protection, said multi-system having primary and secondary circuits, said primary protection circuit being through analysis by specific algorithms in the microcontroller code of the multi-purpose current sensor output signals which are scaled to the line current wherein overload is determined when the output level is beyond the established threshold over a specified time span to make it distinguisable from normal starting characteristics of certain inductive loads, and said secondary protection system being through the use of temperature sensor circuits utilizing temperature sensors strategically located within the apparatus to trip a contactor when temperatures are elevated beyond normal operating temperatures, the said secondary overload protection system being utilized also as secondary circuit to detect glowing connections, said overload protection system being integral part of the apparatus' fault protection and monitoring system.

10. The apparatus of claim 1 wherein the short circuit protection system is through analytic comparison by specific algorithms within the microcontroller code of a multi-purpose current sensor output signals against pre-determined digital definitions of short circuit conditions, said short circuit protection circuit being integral part of the apparatus' fault protection and monitoring system.

11. The apparatus of claim 1 wherein the overvoltage and undervoltage protection system is accomplished through digital analysis within the microcontroller code of the potential transformer signals which are scaled with the line voltage wherein the rated minimum and maximum operating voltages of the said apparatus are pre-determined for comparison, said overvoltage and undervoltage protection circuit being also used in the detection of surge faults through analytic comparison by specific algorithms within the microcontroller code of the potential transformer signal against pre-determined digital definitions of surge conditions, said overvoltage and undervoltage protection circuit being integral part of the apparatus' fault protection and monitoring system.

12. The apparatus of claim 1 wherein a phase shift correction circuit is connected across a line-side line and neutral through a resistive divider to insure continuous monitoring of system conditions and detection of electrical faults regardless when the Line and Neutral connections are reversed, and when there is no system ground available for reference, said circuit being integral part of the apparatus' fault protection and monitoring system.

13. The apparatus of claim 1, said apparatus having an integrated system for identification of different frequencies and operation on different fundamental frequencies of connected power supply, said different frequencies being analyzed through the algorithm based microcontroller software code through digital sampling of signals
which executes specific routines for the detection of electrical faults based on the actual line frequency, said system being integral part of the apparatus' fault protection and monitoring system.

14. The apparatus of claim 1 wherein a phase-loss protection system is applicable to multi-phase systems and managed through the microcontroller receiving data continuously from the outputs of a potential transformer across lines and a multi-purpose current sensor outputs in all the lines, where loss of data from any one of said potential transformer or multi-purpose current sensor outputs determines phase loss, prompting the microcontroller to execute code routines to trip the circuit, identify, and annunciate the fault, said system being integral part of the apparatus' fault protection and monitoring system.

15. The apparatus of claim 1 wherein its system for annunciation of circuit conditions and the occurrence of electrical faults is managed through the microcontroller code through specific routines that identify each and every fault that occurs at any given time, log the event to memory for other system determinations, provide power monitoring information, and output data for visual and audible annunciation, said system being integral part of the apparatus' fault protection and monitoring system.

16. The apparatus of claim 1 wherein a system for self and automatic testing for circuit integrity is accomplished through routines within the microcontroller code which executes a loop of operating functions that includes self test routines, periodic ground fault self test, and determination of end-of-life conditions, trip the circuit when any of said self test fails or when an end-of-life condition occurs, said system being integral part of the apparatus' fault protection and monitoring system.

17. The apparatus of claim 1 wherein a system for testing the operation of a contactor are both managed through the microcontroller in the case of a solenoid operated switching and tripping contactor, wherein switching is manual and tripping is controlled by the microcontroller when the contactor has a manual reset and solenoid tripping mechanism, wherein the contactor should trip when the trip button is pressed and reset when the reset button is pressed, and wherein the test function is executed by the microcontroller implementing routines that simulates different electrical faults as a test for circuit operation integrity, said system being integral part of the apparatus' fault protection and monitoring system.

18. The apparatus of claim 1 wherein a system for determination of end-of-life conditions is controlled by the microcontroller which include determinations if a microcontroller ADC signal received from a current sensor is not normal, if the current sensor signal is not synchronized with a line signal, if any microcontroller standard operating tests including CRC, RAM parity and watchdog timer fails, if a trip circuit is not operating properly, if a reset button would not reset, if any of the self-tests fail, if the reset button fails to reset when activated, if the code does not execute its complete routine functions, if the apparatus' circuit or code is tampered with, any of which occurring will cause tripping of a contactor with annunciation of end-of-life, said system being integral part of the apparatus' fault protection and monitoring system.

19. The system for determination of end-of-life condition of claim 18 being multi-purpose, said multi-purpose system being used as a diagnostic tool to alert users to inspect the apparatus and connected electric wiring for dangerous conditions requiring repair or replacement when the apparatus is re-usable, and it being a self-destruct implement to cause irreversible damage to the apparatus' circuit and erase the microcontroller code to render the apparatus permanently non-operational when it is not re-usable, said system being integral part of the apparatus' fault protection and monitoring system.

20. The apparatus of claim 1 wherein a tamper protection system is multi-levels combining mechanical, electronic and code-managed systems wherein the apparatus' has a housing and the housing is secured by tamper-proof mechanical fasteners to make it difficult to access its parts, wherein parts of the electronic circuitry is secured with ultra thin conductors such that continuity in a part of the apparatus' circuit is severed by merely disassembling the apparatus, wherein the microcontroller is manufactured with internal and external tampering protection, and wherein the microcontroller detects abnormal signals indicative of a tampered circuit, wherein the microcontroller detects instrumentation signals indicative of a tampering operation, and upon said detections of tampering, the microcontroller executes its self-destruct code routine by executing its mass-erase function where the apparatus becomes totally inoperable and the code becomes irrecoverable, said system being integral part of the apparatus' fault protection and monitoring system.

21. The apparatus of claim 1 wherein a system for isolation of the load-side from line-side of the apparatus when a fault is detected and when test button is activated are managed through the microcontroller code wherein a contactor trips when a trip button is pressed and when a fault is detected, and wherein a test function is caused by the microcontroller code implementing a routine that inputs a series of fault data in its routines to simulate faults and thereafter implement the trip routine, tripping the contactor, said system being integral part of the apparatus' fault protection and monitoring system.

22. The apparatus of claim 1 wherein a system for identification of the type of fault that occurred in the circuit are managed through the microcontroller code wherein every fault that occurs is defined through digital analysis of the signals from a multi-purpose current sensor, ground fault current sensor, the temperature sensor circuit, a contactor position sensing circuit, and a potential transformer when the fault occurred and compared with pre-defined digital definitions of various electrical faults, said system identifying and logging the faults into memory, and annunciating the specific fault that occurred, said system being integral part of the apparatus' fault protection and monitoring system.

23. The apparatus of claim 1 wherein its system for identification of claim 22 is used as a diagnostic system for false trip identification and mitigation, wherein every fault that caused a tripping mechanism to trip when it should not is analyzed through specific algorithms in the microcontroller, wherein a digital data of an arc-mimicking load are analyzed for differentiation with actual and real fault conditions to distinguish a false tripping from a normal load that mimics that of an arc, thereby avoiding unnecessary tripping of a contactor, said system being integral part of the apparatus' fault protection and monitoring system.

24. The apparatus of claim 1 wherein a system for power monitoring is executed through the microcontroller processing data received from a potential transformer and multipurpose current sensor reflecting actual voltage and current, respectively, at any given time, making it possible to display current and voltage information and calculate power usage over a time period, output the information locally or remotely through a wired or wireless interface, said system being integral part of the apparatus' fault protection and monitoring system.

25. The apparatus of claim 1 being provided with interface for charging external devices through its power supply system, and an interface for a wired and wireless connectivity for remote operation, circuit monitoring and data analysis, said system being integral part of the apparatus' fault protection and monitoring system.

26. The apparatus of claim 1 wherein a housing is in different forms including a circuit breaker; a convenience outlet, a receptacle; a receptacle outlet; a cord attachment plug; a portable multiple outlet power strip; and the apparatus being integrated into another electrical apparatus, system or any other electrical arrangement.

27. The apparatus of claim 1 wherein a line and neutral wire mounting fixtures, stampings and their vicinity are used as monitoring positions for temperature sensors for overload and glowing connection detection.

28. The microcontroller of claim 1 being a device adequately and suitably equipped with analog to digital converters, digital to analog converters, random access memory, flash memory, input/outputs and peripherals to receive and process signals, output data and drive external devices according to the apparatus' requirements for the detection of electrical faults, monitoring system conditions power monitoring and calculations, said microcontroller further being equipped with self-test features including cyclic redundancy check, RAM parity check, watchdog timer, and tamper-protection.

29. The microcontroller of claim 1 being programmed with a unified code which integrates all the functions and systems of the apparatus, receiving data from a multipurpose current sensor, potential transformer, ground fault current sensor, temperature sensor circuit, contactor position sensing circuit, test and reset circuit, and multipurpose current sensor measurement phase shift correction circuit, processing them to detect tampering and the occurrence of a multitude of electrical faults that include arcs, ground faults, surge, miswire, overload, short circuit, glowing connection, overvoltage, and undervoltage, in DC, and AC, single and multi-phase systems, and execute commands to interrupt a contactor when any of said faults occur, identify and annunciate the fault that occurred, and provide monitoring and power calculation functions, said unified code being capable of executing functions to detect, identify and annunciate specific individual or combination of electrical faults.

30. A system for detection and interruption of electrical circuit arc, surge, miswire, overload, short circuit, glowing connection, undervoltage, overvoltage, and ground faults, and for monitoring of circuit conditions with microcontroller controlled integrated circuits and systems to detect the occurrence of said electrical faults, said system comprising:
an integrated circuit having a system in it to monitor and detect series and parallel arcs,
an integrated circuit having a system in it to monitor and detect ground and leakage current faults,
an integrated circuit having a system in it to monitor and detect surge,
an integrated circuit having a system to monitor and detect miswire,
an integrated circuit having a system in it to monitor and detect overload,
an integrated circuit having a system in it to monitor and detect short circuit,
an integrated circuit having a system in it to monitor and detect glowing connections, said glowing connection detection circuit being a fault preventative system having a temperature sensor circuit being configured within said integrated circuit to pre-emptively detect anomalous circuit connections temperatures,
an integrated circuit having a system in it to monitor and detect overvoltage and undervoltage, all of said integrated circuits' systems operating on either direct current systems, single phase alternating current systems, or multi-phase alternating current systems, and being simultaneously monitored and managed by a microcontroller, said microcontroller being programmed with algorithm based software code, and upon said software code driven microcontroller detecting a fault condition in any of said integrated circuit fault detection systems, said microcontroller identifies said fault, interrupts the circuit, and annunciates the fault that occurred, and sends output data for system conditions and power calculations.

31. A method for detection and interruption of electrical circuit arc, surge, miswire, overload, short circuit, glowing connection, undervoltage, overvoltage, and ground faults, and for monitoring of circuit conditions with microcontroller controlled integrated circuits and systems to detect the occurrence of said electrical faults, said method comprising:

the step of having an integrated circuit having a system in it to monitor and detect series and parallel arcs, the step of having an integrated circuit having a system in it to monitor and detect ground and leakage current faults, the step of having an integrated circuit having a system in it to monitor and detect surge, the step of having an integrated circuit having a system to monitor and detect miswire, the step of having an integrated circuit having a system in it to monitor and detect overload, the step of having an integrated circuit having a system in it to monitor and detect short circuit, the step of having an integrated circuit having a system in it to monitor and detect glowing connections, said glowing connection detection circuit being a fault preventative system having a temperature sensor circuit being configured within said integrated circuit to preemptively detect anomalous circuit connections temperatures, the step of having an integrated circuit having a system in it to monitor and detect overvoltage and undervoltage, all of said integrated circuits' systems operating on either direct current systems, single phase alternating current systems, or multi-phase alternating current systems, and being simultaneously monitored and managed by a microcontroller, said microcontroller being programmed with algorithm based software code, and the step of having upon said software code driven microcontroller detecting a fault condition in any of said integrated circuit fault detection systems, the step of having said microcontroller identify said fault, interrupt the circuit, and annunciate the fault that occurred, and send output data for system conditions and power calculations.

* * * * *